(12) United States Patent
Wang et al.

(10) Patent No.: US 11,831,353 B2
(45) Date of Patent: Nov. 28, 2023

(54) INTEGRATED MULTI-CHANNEL PHOTONICS TRANSMITTER CHIP HAVING VARIABLE POWER DIVIDERS

(71) Applicant: Alpine Optoelectronics, Inc., Fremont, CA (US)

(72) Inventors: Tongqing Wang, Newark, CA (US); Zhoufeng Ying, Milpitas, CA (US); Dawei Zheng, Irvine, CA (US); Jin Yao, San Diego, CA (US)

(*) Notice: Subject to any disclaimer, the term of this patent is extended or adjusted under 35 U.S.C. 154(b) by 5 days.

(21) Appl. No.: 17/659,532

(22) Filed: Apr. 18, 2022

(65) Prior Publication Data

US 2022/0286208 A1 Sep. 8, 2022

Related U.S. Application Data

(63) Continuation-in-part of application No. 17/191,132, filed on Mar. 3, 2021, now Pat. No. 11,336,370.

(51) Int. Cl.
| | |
|---|---|
| *H04B 10/50* | (2013.01) |
| *H04J 14/02* | (2006.01) |
| *H01S 5/14* | (2006.01) |
| *H04B 10/572* | (2013.01) |

(52) U.S. Cl.
CPC ........... *H04B 10/506* (2013.01); *H01S 5/141* (2013.01); *H04B 10/5051* (2013.01); *H04B 10/572* (2013.01); *H04J 14/0209* (2013.01); *H04J 14/0223* (2013.01); *H04J 14/0282* (2013.01)

(58) Field of Classification Search
CPC .......... H04B 10/506; H04B 10/5051; H04B 10/572; H04B 10/564; H04B 10/532; H04B 10/50; H04B 10/501; H01S 5/141; H04J 14/0209; H04J 14/0223; H04J 14/0282; H04J 14/02; H04J 14/06; H04J 14/00; H04J 14/002; H04J 14/0221
See application file for complete search history.

(56) References Cited

U.S. PATENT DOCUMENTS

| | | | |
|---|---|---|---|
| 7,542,675 B1 * | 6/2009 | Graves | H04Q 11/0005 398/94 |
| 10,754,091 B1 * | 8/2020 | Nagarajan | G02B 6/126 |
| 10,944,482 B2 | 3/2021 | Younce et al. | |
| 2004/0160596 A1 | 8/2004 | He | |

(Continued)

*Primary Examiner* — Hibret A Woldekidan
(74) *Attorney, Agent, or Firm* — CIONCA IP Law P.C.; Marin Cionca

(57) ABSTRACT

An integrated transmitter chip comprising: at least one input port disposed at a first end of the integrated transmitter chip; a first variable power divider optically connected to each input port of the at least one input port; a second and a third variable power dividers optically branched from each first variable power divider; a first and a second optical channel optically branched from the second variable power divider, a third and a fourth optical channel optically branched from the third variable power divider; and at least one WDM optically attached to corresponding optical channels and configured to selectively modify the polarization of and multiplex corresponding optical signals into a output optical signal, wherein a laser beam is launched into an input port, split by corresponding variable power dividers based upon each dividers corresponding splitting ratio, then multiplexed and combined into an output optical signal having dual polarization modes.

19 Claims, 9 Drawing Sheets

(56) References Cited

U.S. PATENT DOCUMENTS

| | | |
|---|---|---|
| 2004/0208414 A1 | 10/2004 | Lee |
| 2011/0158576 A1 | 6/2011 | Kissa |
| 2016/0265898 A1* | 9/2016 | Schreuder .......... G01N 21/7746 |
| 2019/0261070 A1* | 8/2019 | Martinho ........... H04B 10/5161 |
| 2019/0273365 A1* | 9/2019 | Zediker ................ H01S 5/4062 |
| 2020/0033228 A1* | 1/2020 | Piazza ................. G01M 11/335 |
| 2021/0173051 A1 | 6/2021 | Ringwald |

* cited by examiner ated multi-channel photonics transmitter chip having variable power dividers and multiplexers.

INTEGRATED MULTI-CHANNEL PHOTONICS TRANSMITTER CHIP HAVING VARIABLE POWER DIVIDERS

CROSS-REFERENCE TO RELATED APPLICATIONS

This application is a continuation-in-part and claims the benefit of U.S. Non-Provisional application Ser. No. 17/191,132, filed on Mar. 3, 2021, which is hereby incorporated by reference, to the extent that it is not conflicting with the present application.

BACKGROUND OF INVENTION

1. Field of the Invention

The invention relates generally to integrated multi-channel photonics transmitter chips, and more specifically to integrated photonics transmitter chips having variable power dividers and multiplexers.

2. Description of the Related Art

In the field of integrated photonics, integrated photonics transmitter chips, supporting pulse amplitude modulation (PAM) signals (e.g., 400 Gbps DR4 transceivers, supporting four lanes of 100 Gbps 4-level PAM signals) over 500 m-reach parallel single mode fibers at O-band (approximately 1310 nanometers), have become a mainstream solution for next-generation data-center optical interconnects. Conventionally, a DR4 transmitter chip structure comprises four input and output ports, with four optical channels extending between the input and output ports, respectively. In operation, each channel may receive and transmit a laser beam entering each respective input port, the laser beam propagating across the transmitter chip and having the amplitude or the phase of the laser beam adjusted. The laser beams may subsequently be coupled into the single mode fibers via the output ports carrying an output power for various data-center optical applications.

As a first approach, each channel of the transmitter chip may be provided with a laser source, such that four laser sources are optically aligned to the four input ports of the transmitter chip, for example. This first approach may allow the power of each laser signal being transmitted via the transmitter chip to be independently adjusted (by adjusting the power of the laser source, for example), which may be advantageous for the various data-center optical interconnects, as stated above. However, utilizing a total of four laser sources, as stated, may complicate the optical assembly and optical coupling processes due to the total number of laser sources. This approach may also increase the assembly cost and the associated operational costs due to the increase in overall power consumption drawn by the four laser sources. Alternatively, in order to decrease the assembly and operational costs, hybrid lasers can be integrated directly onto the transmitter chip, but such an approach may require costly process development and a highly reliable laser yield (if at least one laser fails, the functionality of the whole chip fails).

Thus, conventionally, the four optical channels of the transmitter chip are configured to share either one single laser source or two laser sources, depending on the constraints of the required optical link budget and the availability of high-power lasers, for example. As a second approach, when a single laser source is used, the transmitter chip structure may be designed as having a single optical input port, followed by three 1×2 splitters (e.g., couplers) cascaded in two subsequent stages, as an example. As a third approach, when two laser sources are used, the transmitter chip structure may be designed as having two optical input ports, followed by two 1×2 splitter couplers, for example. In either the second or the third approach, the splitters are conventionally configured with a 50/50 splitting ratio, such that a laser light beam passing through each splitter/coupler is split equally in half, thus effectively splitting the power of the laser light beam equally in half as well. The split laser signals may then pass through a modulator and a phase shifter as the laser signals propagate along the transmitter chip. A photodetector may be placed on each optical channel following the modulator and phase shifter for power monitoring and quadrature point control, for example. Finally, the laser signals may exit the transmitter chip via the four output ports, each laser signal having a final transmitted output power.

While the second and third approaches described above may result in the transmission of laser light power while simplifying the optical assembly process, the output power of each laser light signal is incapable of being independently adjusted due to the sharing of the laser light source(s) (via the splitters, for example). As such, due to different path length of different channels of the transmitter chip, the optical propagation loss in each channel could be different, causing non-uniform power output. For certain applications, uniform power among all the channels of the transmitter chip is required. Furthermore, should an optical channel on the transmitter chip be defective (due to chip manufacturing process imperfections/variations, for example), the transmitter chip lacks means for compensating or correcting any loss of laser light power due to said optical channel defect or differing path length.

Additionally, a transmitter chip that is configured to generate a plurality of optical signals may need to utilize a plurality of optical connections to suitably transmit each optical signal. Without a suitable mechanism for combining produced optical signals, more complex transmitters may become highly cumbersome. A device such as a multiplexer may be used to combine corresponding simpler optical signals into higher complexity combined optical signals. Generally, for continuing optical signals, wavelength-division multiplexing (WDM) and polarization-division multiplexing (PDM) technologies are used to multiplex multiple optical signals onto a single output transmitting channel (for example, a single optical fiber). The key requirements for optical signal multiplexing devices are low insertion loss and tolerance to wavelength shifts resulting from temperature and manufacturing variations. The WDM technology multiplexes a number of optical signals using different wavelengths while the PDM technology multiplexes optical signals using orthogonal polarization states of optical waves (for example, TE and TM polarization states) which may have the same wavelengths. However, the utilization of multiplexing technologies may present additional challenges. For example, many standard multiplexing systems behave differently based on the wavelength and polarization of a signal (e.g., may have different insertion losses which cause the output optical signals non-uniform). Furthermore, a transmitter that utilizes a standard multiplexer may also lack a mechanism of suitably adjusting the power of each optical signal going into a multiplexer, thus limiting the flexibility and utility of said transmitter.

Therefore, there is a need to solve the problems described above by providing an integrated transmitter chip, and method, comprising cascaded variable power dividers for efficiently and cost-effectively tuning the output power of optical signals being transmitted via the integrated transmitter chip and a suitable multiplexer configured to combine a plurality of optical signals into fewer optical outputs prior to transmission.

The aspects or the problems and the associated solutions presented in this section could be or could have been pursued; they are not necessarily approaches that have been previously conceived or pursued. Therefore, unless otherwise indicated, it should not be assumed that any of the approaches presented in this section qualify as prior art merely by virtue of their presence in this section of the application.

BRIEF INVENTION SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

In an aspect, an integrated transmitter chip is provided, the integrated transmitter chip comprising: four input ports disposed at a first end of the integrated transmitter chip; a transmitter block optically connected to each input port of the four input ports, each transmitter block having: a first variable power divider optically connected to the corresponding input port; a second variable power divider and a third variable power divider being optically branched from the first variable power divider, such that the first, second and third variable power dividers are arranged in a cascading formation having two cascading stages, wherein the first, second and third variable power dividers each have a corresponding splitting ratio; a first and second optical channel being optically branched from the second variable power divider; a third and fourth optical channel being optically branched from the third variable power divider; and four wavelength division multiplexers optically connected to the transmitter blocks, each wavelength division multiplexer having: a first multiplexing subunit optically connected to two corresponding optical channels and configured to multiplex two corresponding optical signals into a first combined optical signal; a second multiplexing subunit optically connected to two corresponding optical channels and configured to multiplex two corresponding optical signals into a second combined optical signal; and a polarization rotator and beam combiner optically connected to the first multiplexing subunit and the second multiplexing subunit, the polarization rotator and beam combiner being configured to rotate the polarization of the second combined optical signal while combining the first combined optical signal and the second combined optical signal into a corresponding output optical signal. Thus, an advantage is the ability to tune and therefore control the splitting ratio of each variable power divider, thus allowing control of the powers of the individual optical signals being transmitted via the transmitter chip. Another advantage is that the disclosed integrated transmitter may accommodate utilization of multiple lasers within the transmitter assembly, negating the need for using separate transmitter chips having different designs, which may thus reduce operational costs associated with purchasing and swapping out more than one transmitter chip. An additional advantage is that the cascaded variable power dividers have the ability to adjust the distribution of the input optical power among all optical channels, such that to meet a desired level of power uniformity at the transmitter output for each optical signal. Another advantage is the ability to compensate for or correct deficiencies in the output power of the transmitter chip using the variable power dividers, and thus improving the overall production yield. Another advantage of the variable power dividers is the reduction in operational costs associated with channel shut-off requirements, due to the reduced power consumption. Another advantage is that the wavelength division multiplexers may be used in conjunction with their corresponding variable power dividers, such that the variable power dividers maintain a selected power level for each generated optical signal, which the wavelength division multiplexer then multiplexes and combines into fewer output optical signals, thus reducing the amount of outlet ports and outlet port optical connections required, further reducing costs. Another advantage is that polarization rotator and beam combiner within the wavelength division multiplexer facilitates the utilization of multiple polarization modes within the output optical signal, thus allowing the wavelength division multiplexer to maintain a passband having a flat shape and a low insertion loss.

In another aspect, an integrated transmitter chip is provided, the integrated transmitter chip comprising: a plurality of input ports disposed at a first end of the integrated transmitter chip; at least one variable power divider being optically connected to each input port of the plurality input ports, each variable power divider being tunable to a corresponding splitting ratio; a plurality of optical channels, wherein two corresponding optical channels of the plurality of optical channels are optically branched from each variable power divider; a plurality of wavelength division multiplexers optically connected to corresponding optical channels. Again, an advantage is the ability to tune and therefore control the splitting ratio of each variable power divider, thus allowing control of the powers of the individual optical signals being transmitted via the transmitter chip. Another advantage is that the disclosed integrated transmitter may accommodate utilization of a plurality of lasers within the transmitter assembly, negating the need for using separate transmitter chips having different designs, which may thus reduce operational costs associated with purchasing and swapping out more than one transmitter chip. An additional advantage is that the variable power dividers may be provided in a cascaded arrangement, and thus may have the ability to adjust the distribution of the input optical power among all optical channels, such that to meet a desired level of power uniformity at the transmitter output for each optical signal. Another advantage is the ability to compensate for or correct deficiencies in the output power of the transmitter chip using the variable power dividers, and thus improving the overall production yield. Another advantage of the variable power dividers is the reduction in operational costs associated with channel shut-off requirements, due to the reduced power consumption. Another advantage is that the wavelength division multiplexers may be used in conjunction with their corresponding variable power dividers, such that the variable power dividers maintain a selected power level for each generated optical signal, which the wavelength division multiplexer then multiplexes and combines into fewer output optical signals, thus reducing the amount of outlet ports and outlet port optical connections required, further reducing costs. Another advantage is that polarization rotator and beam combiner within the wavelength division multiplexer facilitates the utilization of multiple polarization modes within the output optical signal, thus allowing the wavelength division multiplexer to maintain a passband having a flat shape and a low insertion loss.

In another aspect, an integrated transmitter chip is provided, the integrated transmitter chip comprising at least one wavelength division multiplexer having: a first multiplexing subunit configured to multiplex a first plurality of optical signals into a first combined optical signal; a second multiplexing subunit configured to multiplex a second plurality of optical signals into a second combined optical signal; a polarization rotator and beam combiner optically connected to the first multiplexing subunit and the second multiplexing subunit, the polarization rotator and beam combiner being configured to rotate the polarization of the second combined optical signal while combining the first combined optical signal with a second combined optical signal to produce an output optical signal. Again, an advantage is that the wavelength division multiplexers may be used in conjunction with optically attached variable power dividers, such that the variable power dividers maintain a selected power level for a plurality of generated optical signal, which the wavelength division multiplexer may then multiplex and combine into fewer output optical signals, thus reducing the amount of outlet ports and outlet port optical connections required, reducing costs. Another advantage is that polarization rotator and beam combiner within the wavelength division multiplexer facilitates the utilization of multiple polarization modes within the output optical signal, thus allowing the wavelength division multiplexer to maintain a passband having a flat shape and a low insertion loss.

The above aspects or examples and advantages, as well as other aspects or examples and advantages, will become apparent from the ensuing description and accompanying drawings.

BRIEF DESCRIPTION OF THE DRAWINGS

For exemplification purposes, and not for limitation purposes, aspects, embodiments or examples of the invention are illustrated in the figures of the accompanying drawings, in which.

DETAILED DESCRIPTION

Figure 1:
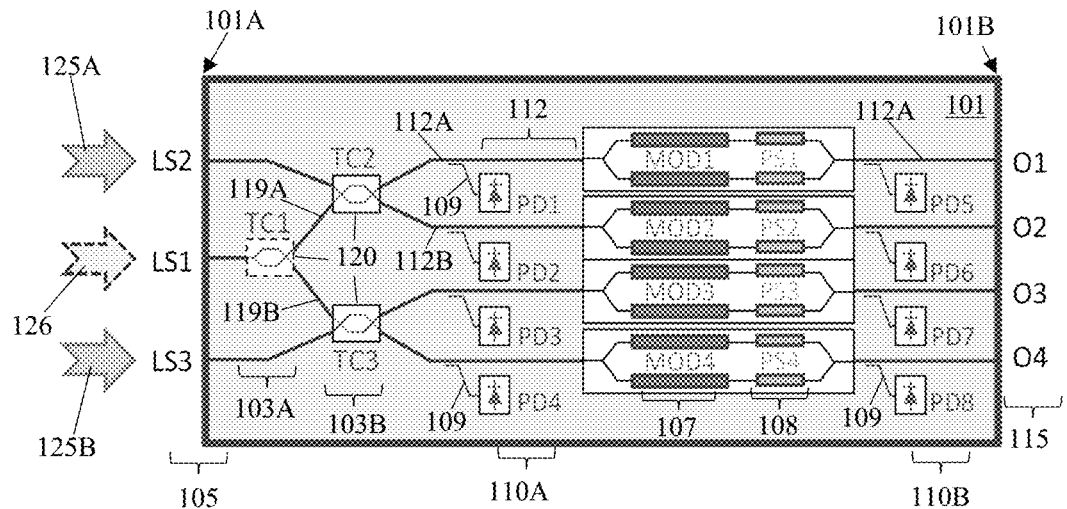
FIG. 1 is a diagram illustrating a top view of an integrated four-channel transmitter chip having cascaded variable power dividers, according to several aspects.

What follows is a description of various aspects, embodiments and/or examples in which the invention may be practiced. Reference will be made to the attached drawings, and the information included in the drawings is part of this detailed description. The aspects, embodiments and/or examples described herein are presented for exemplification purposes, and not for limitation purposes. It should be understood that structural and/or logical modifications could be made by someone of ordinary skills in the art without departing from the scope of the invention. Therefore, the scope of the invention is defined by the accompanying claims and their equivalents.

It should be understood that, for clarity of the drawings and of the specification, some or all details about some structural components or steps that are known in the art are not shown or described if they are not necessary for the invention to be understood by one of ordinary skills in the art.

For the following description, it can be assumed that most correspondingly labeled elements across the figures (e.g., 101 and 201, etc.) possess the same characteristics and are subject to the same structure and function. If there is a difference between correspondingly labeled elements that is not pointed out, and this difference results in a non-corresponding structure or function of an element for a particular embodiment, example or aspect, then the conflicting description given for that particular embodiment, example or aspect shall govern.

FIG. 1 is a diagram illustrating a top view of an integrated four-channel transmitter chip 101 having cascaded variable power dividers 120, according to several aspects. As shown in FIG. 1, the integrated four-channel transmitter chip ("integrated four-channel transmitter chip," "integrated transmitter chip," "integrated transmitter," "transmitter chip") 101 may comprise three input ports 105 (LS1-LS3), for example, disposed at a first end 101A, by which laser light beams ("laser light beams," "laser beams," "laser signals," "optical signals") may be launched into the integrated transmitter 101. The input ports 105 may be edge couplers, for example, or any other suitable optical port. It should be understood that more than three or fewer than three input ports 105 may be provided on the transmitter chip 101, as needed, as will be described in more detail later. As an example, at least one laser source (not shown) may be optically aligned to the first end 101A of the integrated transmitter 101, such that at least one laser beam (e.g., 126) may be transmitted via the optical channels 112 to fibers (disposed in a fiber array, or a lens (array) with a fiber (array), for example) optically aligned to a second/output end 101B of the integrated transmitter 101. As shown in FIG. 1, the transmitter chip 101 may comprise four optical channels 112 extending at least partially a length of the transmitter chip 101, and optically connected to four output ports 115 disposed at the second end 101B, as an example. It should be understood that more or fewer optical channels 112 may be provided on the transmitter chip 101, as needed, and thus, more or fewer than four output ports 115 may be provided as well, such that to match the number of optical channels, as will be discussed later below.

As similarly described in the Background above, each optical channel 112 may be provided with a modulator 107 followed by a phase shifter 108, as shown. As an example, the modulators 107 may be any suitable optical modulators, such as silicon optical modulators, graphene optical modulators, Mach-Zehnder Interferometer-based modulators, etc. for modulating the laser signals propagating along the optical channels 112, for example. Additionally, the phase shifters 108 may be any suitable optical phase shifters, such as thermo-optic phase shifters, silicon photonic phase shifters, etc. for controlling the phase shift of the laser signals propagating along the optical channels 112, for example. Each modulator 107 and phase shifter 108 pair may be followed by a tap coupler 109 and a photodetector (e.g., PD5) 110B, as shown, adapted to measure the power (via the light intensity, for example) of the laser signal propagating toward the output ports 115. The photodetectors 110B (PD5-PD8) may be germanium photodetectors, for example. As an example, the photodetectors 110B may allow an external computer (not shown) to monitor the power of each optical signal being transmitted via the transmitter 101 for tuning of the power, as needed.

As mentioned previously above, the integrated transmitter 101 may comprise three input ports 105 disposed at the first end 101A, as an example. As described previously in the Background above, conventional DR4 transmitter chips may be adapted to transmit laser light originating from either a single laser source or two laser sources. As will be described in detail herein, the transmitter chip 101 shown in FIG. 1 may be adapted to support either approach, such that the same chip can accommodate a single laser source or two laser sources, rather than having to use two separate chips of different design, for example. As shown, the input ports 105 may optically connect to the cascaded variable power dividers 120, provided in two stages 103A and 103B, as an example. As an example, the variable power dividers 120 may be realized using tunable couplers/splitters based on various suitable structures, such as, for example, Mach-Zehnder Interferometer (MZI) switches, multi-port splitters, resonators, Micro-Electro-Mechanical Systems (MEMS), etc. As shown in FIG. 1, the variable power dividers 120 may be provided as 1×2 tunable couplers, as shown by TC1, or as 2×2 tunable couplers, as shown by TC2 and TC3, for example. It should be understood that more than three or fewer than three tunable couplers 120 may be provided on the transmitter chip, as needed, as will be discussed later below.

As described previously in the Background above, DR4 transmitter chips are conventionally provided with passive splitters (couplers) having fixed 50/50 splitting ratios, for example. As discussed, when a laser light beam passes through the splitter, the resultant pair of laser light beams each possesses the same or substantially the same light intensity, and therefore power. The variable power dividers (e.g., tunable couplers) 120 may be adapted to tune their respective splitting ratios from 100/0 to 0/100, as opposed to the fixed 50/50. Therefore, like a conventional passive splitter, the laser light beam passing through the variable power divider 120 may be split into two individual laser light beams, however, the resultant intensity, and therefore power, of each individual laser light beam may be optically portioned and selected by tuning the splitting ratio ranging from 100/0 to 0/100, as an example. Referring back to FIG. 1, the cascaded variable power dividers 120 may split the initial three input ports 105 into the four optical channels 112. As shown, a first tunable coupler TC1 may branch input port LS1 into two waveguides/channels 119A and 119B, for example. Input port LS2 and the waveguide branch 119A may optically connect to a second tunable coupler TC2, as shown, and similarly, the waveguide branch 119B and input port LS3 may optically connect to a third tunable coupler TC3, as an example, at the second stage 103B. The pair of tunable couplers TC2 and TC3 may then each branch off into two arms, thus forming the four optical channels 112, as shown as an example.

As shown, following the variable power dividers 120, the four optical channels 112 may each be provided with a first photodetector (e.g., PD1) 110A. As mentioned above, a second set of photodetectors 110B may be optically connected (via tap couplers 109) to the four optical channels 112 following the phase shifters 108, as shown. The first set of photodetectors 110A (PD1-PD4) may be optically connected to the optical channels 112 each via a tap coupler 109, for example, as shown. The first set of photodetectors 110A may be adapted to detect and monitor the power of the incoming laser light signal (during the initial laser-to-transmitter optical alignment process) and may also provide feedback signals to the external computer (not shown) for controlling of the tunable couplers 120 and for monitoring the power variation of the laser light signals during operation of the transmitter chip, for example. Thus, an advantage is the ability to tune and therefore control the splitting ratio of the variable power dividers, thus allowing control of the powers of the individual optical signals being transmitted via the optical channels of the transmitter chip.

As mentioned above when referring to FIG. 1, the integrated transmitter 101 may be configured to support either a single laser source or two laser sources, such that both approaches are supported using the single disclosed transmitter chip, for example. Thus, in accordance with an aspect of the current invention, a method of transmitting optical power from a single or a dual laser source using the disclosed integrated transmitter chip of FIG. 1 is provided, which will be described in detail below.

As shown previously in FIG. 1, let a single laser source (not shown) be used to transmit optical power, as a first case. As an example, the single laser source (not shown) may launch a laser light beam 126 into the input port 105 at LS1, as shown. The laser light beam 126 may enter the transmitter chip 101 via the input port LS1 and may propagate toward the first tunable coupler TC1, as an example. The laser light beam may be optically split by the first tunable coupler TC1, the two resultant light beams each having a power defined by the splitting ratio defined by the first tunable coupler TC1. The now two laser light beams (not shown) may propagate along waveguides 119A and 119B toward the second stage (103B) second and third tunable couplers TC2 and TC3, respectively, such that the two laser light beams (not shown) are split into four laser light beams (not shown) now propagating along the four optical channels 112, as an example. The first set of photodetectors 110A may continuously measure the power of the four laser light beams (not shown), such that to monitor the functionality and efficiency of the splitting ratios set by the variable power dividers 120, for example. The splitting ratios of the variable power dividers 120 may be adjusted, as needed, as will be discussed in more detail below, to make any power adjustments. The laser light beams (not shown) may be directed through the modulators 107 and the phase shifters 108 and may be coupled out of the transmitter chip 101 via the output ports 115, as shown as an example. Thus, the disclosed transmitter chip 101 may efficiently enable the transmission of laser light power originating from a single laser source.

As a second case, let two laser sources (not shown) be used to transmit optical power, as an example. As shown as an example, the two laser sources (not shown) may launch a first and a second laser light beams 125A and 125B, respectively, into the input ports 105 at LS2 and LS3, respectively. The laser light beams 125A and 125B may enter the transmitter chip 101 via the input ports LS2 and LS3, respectively, and may propagate toward the second and the third tunable couplers TC2 and TC3, respectively, as an example. The first and the second laser light beams 125A, 125B may be split by the second and the third tunable couplers TC2, TC3, respectively, such that the four resultant light beams possess a power defined by the splitting ratios of the second and the third tunable couplers TC2 and TC3, respectively. The four laser light beams (not shown) may propagate along the four optical channels 112, as an example, and the first set of photodetectors 110A may continuously measure the power of the four laser light beams (not shown), such that to monitor the functionality and efficiency of the splitting ratios set by the tunable couplers 120, as similarly described above. The laser light beams (not shown) may be directed through the modulators 107 and the phase shifters 108 and may be coupled out of the transmitter chip 101 via the output ports 115, as shown as an example. Thus, the disclosed transmitter chip 101 may efficiently enable the transmission of laser light power originating from two laser sources. As an example, to achieve certain power uniformity levels at the output 101B, it may be required or preferable to also adjust the input laser power, which will be described in more detail below. It should be noted that, as described above, the three input ports 105 will not all simultaneously be used during any given operation, such that, in other words, either LS1 is used with a single laser or LS2 and LS3 are used with two lasers, respectively. Thus, an advantage is that the disclosed integrated transmitter may accommodate either single or double laser transmission approaches, negating the need for using separate chips of different design for either approach, which may thus reduce operational costs associated with purchasing and swapping out more than one transmitter chip.

As described throughout this disclosure above, the variable power dividers 120 shown in FIG. 1 may enable the selection of splitting ratios ranging from 100/0 to 0/100, rather than the fixed 50/50 splitting ratio of conventional splitters. As will be described in detail below, the use of tunable couplers provides a number of recognizable benefits. As a first benefit, the cascaded variable power dividers 120 enable optical switching among the four optical channels, and thus channel shut off, which will be discussed in greater detail later, such that, by setting any one of the tunable couplers 120 to have a splitting ratio of 100/0 or 0/100, a particular optical channel may be shut off (corresponding to the 0 in the splitting ratio), whereby no optical signal can travel along that particular optical channel. Thus, an advantage of the variable power dividers is optical signal output power control via the optical switching between channels. As a second benefit, the tunable couplers 120 may provide the ability to adjust the transmitter output power uniformity with respect to the four optical channels 112. As an example, depending on the optical application, some particular level of power uniformity may be required. In some cases, the four optical channels 112 may have different routing lengths on the chip 101, and may thus experience different levels of loss, resulting in different levels of output optical power across the output ports 115. By tuning the splitting ratios of the variable power dividers 120, the final output power of each optical channel 112 at the output 101B of the transmitter chip 101 can be adjusted, as needed, to meet that particular level of power uniformity. In comparison, conventional splitters having fixed splitting ratios provide a fixed level of power uniformity and would thus not be able to meet certain power uniformity levels. Thus, an advantage is the ability to tune the power splitting ratio of the input optical signal, such that to meet a desired level of power uniformity at the transmitter output.

As another benefit, the variable power dividers 120 shown previously in FIG. 1 may allow the transmitter chip 101 to correct and/or compensate for instances of failed and/or diminished output power. As described briefly previously in the Background above, in certain situations transmitter chip operation may be hindered by a low output power on a certain optical channel on the transmitter chip, due to unpredicted defects on an optical channel, roughness at the facets due to the presence of dust or dirt particles, imperfect fiber array channel spacing at the output of the transmitter, etc., for example, resulting in lower total output power than expected. While the conventional approaches provide no means for addressing instances of power loss or failure, the variable power dividers (e.g., tunable couplers) 120 disclosed herein may allow optical power from one channel to be directed (in some quantity) to another channel to overcome the output power loss or failure. As an example, referring to FIG. 1, should the first optical channel 112A possess some defect (one of those mentioned above), such that the output power of the optical signal exiting output port O1, as shown, is lower than expected, the tunable coupler TC2 may appropriately be controlled (via the external computer, for example), such that the splitting ratio of the tunable coupler TC2 is gradually adjusted from default 50/50 (50% to channel 112A, 50% to channel 112B) to another splitting ratio, until the measured output power of channel 112A and channel 112B are equal or substantially equal. In this way, both channel 112A and channel 112B have reasonable output power. It should be understood that the photodetectors PD1 and PD2 may monitor the power in channels 112A and 112B, respectively, such that the computer (or user) can ensure correct functionality, as will be described in greater detail when referring to FIG. 2 below. Thus, the power that was being lost via channel 112A at output port O1 has been compensated for via the now equal output power at output port O2 via channel 112B, as an example.

Thus, an advantage is the ability to compensate for or correct deficiencies in the output power of the transmitter chip using the variable power dividers, and thus improving the overall production yield. The increase in overall production yield is a particularly significant advantage of the disclosed photonics transmitter chip. In contrast, conventional multi-channel DR4 transmitter chips typically have lower overall production yield. It should be understood that all of the above-described advantages may be relevant for either the single laser case or the dual laser case.

As mentioned above, the variable power dividers 120 may enable optical channel shut-off, such that no optical signal is outputted from a particular optical channel (112) on the transmitter chip 101, for example. As an example, in practice, it may be required by operation specifications that the transmitter output power of one or a few optical channels be able to be shut-off, usually requiring about 15 dB~30 dB (decibel) attenuation to effectively extinguish the optical signal power. Although carrier-injection based variable optical attenuators (VOAs) can be optically integrated onto each optical channel for initiating channel shut-off, injection current of as large as hundreds of milliamperes is required to obtain a minimum of 15 dB attenuation, which greatly increases the overall power consumption of the DR4 transmitter. As an example, achieving 15 dB optical attenuation using integrated VOAs may require about 0.15-0.30 Watts (W) of additional power for a single optical channel only a few millimeters (mm) in length. As such, when more than 15 dB of optical attenuation is required, or if more than one optical channel is required to be shut-off, the overall power consumption rises even more. To combat this increase in overall power consumption, the length of the VOA integrated onto each optical channel can be increased. However, this increase in VOA length for each optical channel increases the transmitter chip size and the optical propagation loss, as well as decreases the overall production outputs. Moreover, VOAs have been shown to be sensitive to variations in temperature, which may hinder transmitter performance. The attenuation capability of the VOAs is sensitive to process variation, making it difficult to effectively control the VOA yield, as an example.

The variable power dividers 120 disclosed herein may serve as an efficient and cost-effective alternative for the integrated VOAs described above. As similarly described above, should one of the optical channels (e.g., 112A) be required to shut-off, due to product specifications, the tunable coupler TC2 may be tuned, by adjusting the splitting ratio to 0/100, for example, to effectively negate any power output along channel 112A, and thus effectively shutting off channel 112A, as needed per the example. In order to reduce any output power spikes incurred by the shutting off of channel 112A, as an example, tunable coupler TC1 may also be tuned and the input power of the laser source may also be adjusted, for example, to reduce the effective input laser power accordingly, such that the same optical power level is maintained at the output 101B. As similarly mentioned above, the control algorithm of the computer can be further adapted to control the channel shut-off process, such that, depending on product specifications, the optical channels may be optically attenuated upwards of over 25 dB with electrical power consumption below 20 mW. Thus, particularly in comparison to carrier-injection based VOAs, the required power consumption of the tunable couplers for channel shut-off is greatly reduced. Thus, an advantage of the cascaded variable power dividers is the reduction in operational costs associated with channel shut-off requirements, due to the reduced power consumption.

Figure 2:
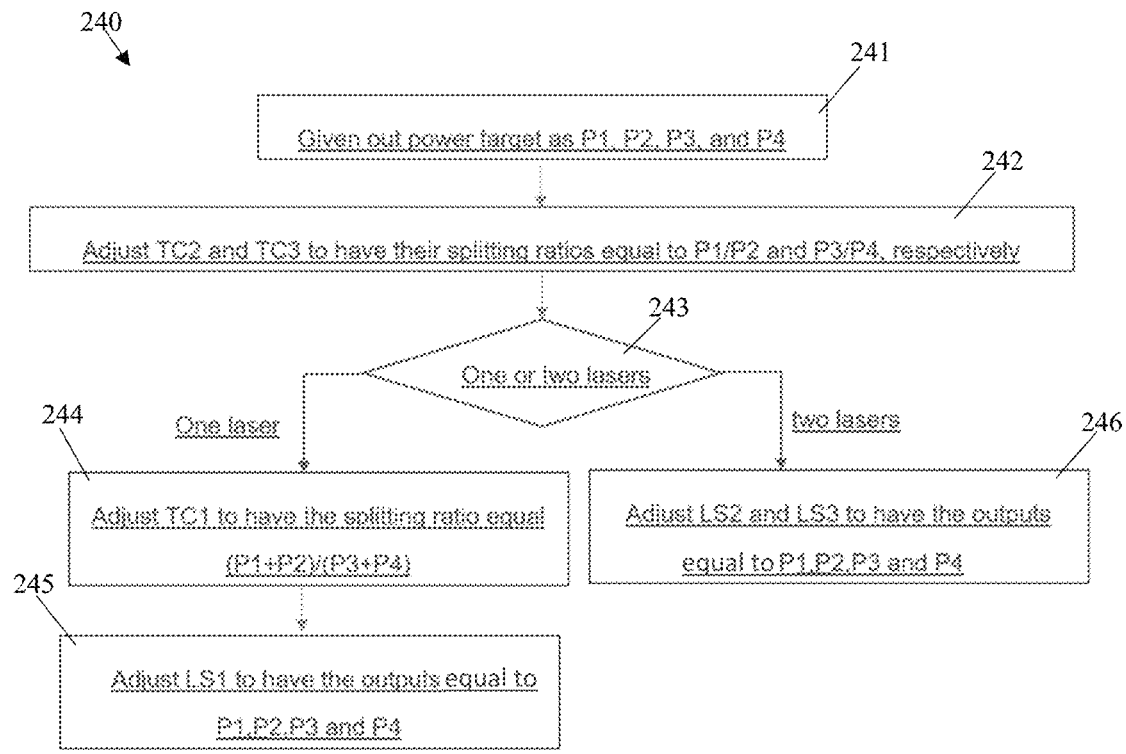
FIG. 2 is a flowchart illustrating a control algorithm for monitoring and varying the optical power of an input optical signal being transmitted via the integrated four-channel transmitter chip of FIG. 1, according to an aspect.

FIG. 2 is a flowchart illustrating a control algorithm 240 for monitoring and varying the optical power of an input optical signal being transmitted via the integrated four-channel transmitter chip of FIG. 1, according to an aspect. As mentioned above, in practice, the transmitter chip may be in electrical communication with an external computer programmed with a control algorithm. Specifically, the computer may be in electrical communication with the variable power dividers (120) and the sets of photodetectors (110A and 110B), shown previously in FIG. 1. As described above as an example, the tunable couplers may be controllable such that their respective tuning/splitting ratios may be adjusted. The control algorithm operating on the computer may be adapted to set the tuning ratios, based on power data collected via the photodetectors (110A and 110B), such that the tunable couplers (120) may be controlled in real-time, as an example. Thus, the adjusting and setting of the splitting ratios may be automated during use of the integrated transmitter chip, such that any detected power loss may be compensated for/corrected by the dynamic adjustment of the splitting ratios, as an additional benefit. As will be described in detail below, the control algorithm may thus enable the computer to autonomously control the adjustment of the variable power dividers using the power measured via the photodetectors.

As shown in FIG. 2, for a given 4-channel application, as an example, let the laser light signals being output from the output ports O1-O4 (115 in FIG. 1) have an output power, as described previously throughout this disclosure above. As indicated at 241, upon initial operation of the 4-channel transmitter chip, the laser light signals being output from the transmitter chip may be given a certain output power target, defined as P1, P2, P3, and P4 for output ports O1-O4, respectively. Once the P1-P4 values have been set (autonomously by the computer, by a user, preset by a programmer, etc.), the second stage (e.g., 103B in FIG. 1) variable power dividers (120) may be adjusted. As shown at 242, the splitting ratios of the tunable couplers TC2 and TC3 may be set to P1/P2 and P3/P4, respectively. The control algorithm 240 may utilize the power readings measured by the photodetectors P1-P8 (110A and 110B in FIG. 1) to monitor the powers P1, P2, P3, and P4 during this process, as an example. As described in detail previously when referring to FIG. 1, the 4-channel integrated photonics transmitter chip disclosed herein may function with and accommodate a single laser source or a dual laser source. As indicated at 243, depending on whether a single laser or a double laser is being used with the transmitter chip, the control algorithm 240 may proceed with one of two paths, as will be described below.

Accordingly, if one laser is being used to transmit laser light through the transmitter chip, as shown at 244, the splitting ratio of the tunable coupler TC1 (shown in FIG. 1, for example) may be set to (P1+P2)/(P3+P4). Subsequently, as shown at 245, the single laser source may be adjusted until the power outputs are equal to the desired output power targets P1, P2, P3 and P4 for the output ports O1-O4, respectively. On the other hand, if two laser sources are being used to transmit laser light through the transmitter chip, as shown at 246, the two laser sources may be adjusted until the power outputs are equal to the desired output power target P1, P2, P3 and P4 for the output ports O1-O4, respectively, and thus signifying an optimal transmission of optical power.

It should be understood that the above-described control algorithm may alternatively be executed manually, by, for example, a user, as desired. It should also be understood that the control algorithm shown and described in FIG. 2 may be expanded and modified accordingly to accommodate larger or smaller multi-channel transmitter chips, such as, for example, 2-channel, 3-channel, 5-channel, 8-channel, 16-channel, etc., chips. It should also be understood that the control algorithm 240 described above may be applied for channel-shutoff, described previously when referring to FIG. 1, for example, by setting any output power target to zero (e.g., P1=0).

Figure 3:
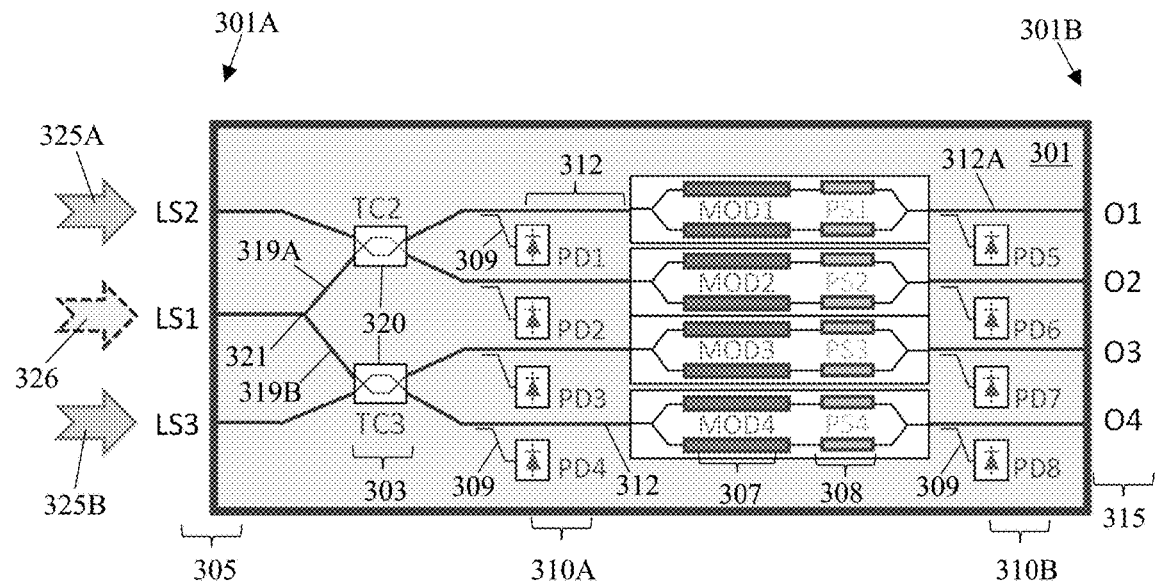
FIG. 3 is a diagram illustrating a top view of an alternative embodiment of the integrated four-channel transmitter chip of FIG. 1, according to an aspect.

FIG. 3 is a diagram illustrating a top view of an alternative embodiment 301 of the integrated four-channel transmitter chip 101 of FIG. 1, according to an aspect. As an example, the alternative embodiment 301 of the transmitter chip 101 described throughout this disclosure above may be used with a single laser source or two laser sources for the transmission of laser light power, as similarly described above. As shown in FIG. 3, the integrated transmitter chip 301 may comprise the three input ports 305, the four optical channels 312 extending at least partially a length of the transmitter chip 301, and the four output channels 315. Additionally, as described above when referring to FIG. 1, each optical channel 312 may comprise two sets of photodetectors 310A and 310B, as shown, and an integrated modulator 307 and phase shifter 308, for example. As will be discussed in more detail below, this alternative embodiment 301 may comprise two variable power dividers 320, as opposed to the three shown previously in FIG. 1.

As shown in FIG. 3, the transmitter chip 301 may comprise a splitter (e.g., a 1×2 coupler) 321 having a fixed splitting ratio of 50/50, such as those conventionally used in integrated photonics, in place of the first-stage variable power divider (e.g., tunable coupler TC1) shown previously in FIG. 1. The two variable power dividers 320 (tunable couplers TC2 and TC3) may be provided parallelly in a single stage 303 following the splitter 321, as shown as an example. The variable power dividers 320 may be 2×2 tunable couplers, for example, as described previously above. As shown, the splitter 321 and the tunable couplers 320 may optically connect (via waveguides, for example) to the three input ports 305. As an example, the input port LS1 may optically connect to the splitter 321, which may branch off into two waveguides/channels 319A and 319B, which may optically connect to the tunable couplers TC2 and TC3, respectively, as shown. Input ports LS2 and LS3 may also optically connect to the tunable couplers TC2 and TC3, respectively. The tunable couplers TC2 and TC3 may then each branch off into two branches, such that to form the four optical channels 312, as similarly described previously above. As mentioned above, the splitter 321 may be a conventional 1×2 coupler, for example, such that the splitting ratio of the splitter 321 is fixed at 50/50. Thus, as described above, optical signals passing through the splitter 321 will be split equally in half, such that the resultant powers of the split outgoing signals are the same (or substantially the same) value, for example. Thus, in this embodiment 301, only the tunable couplers TC2 and TC3 may be tuned, such that their respective splitting ratios may be adjusted, as an example.

As mentioned above, the transmitter chip 301 may be adapted to support either the single laser approach or the dual laser approach, as similarly described when referring to FIG. 1. As shown, let a single laser source (not shown) be optically aligned to the input port LS1 of the first end 301A of the transmitter chip 301, as an example. The single laser source (not shown) may launch laser light 326 into the transmitter chip 301 via the input port LS1, as shown as an example. The laser light signal 326 may propagate toward the splitter 321, and may be split in half, for example, such that the resultant laser light beams (not shown) possess the same power. The split laser light beams (not shown) may each propagate along waveguides 319A and 319B toward the tunable couplers TC2 and TC3, respectively, as shown, such that each laser light beam may be split a second time, according to the splitting ratio of each tunable coupler TC2, TC3, respectively, for example. The resultant four laser light beams (not shown) may propagate along the four optical channels 312 and be coupled out of the transmitter chip 301, such that the output optical power is transmitted to an external device (not shown) aligned at the output end 301B, for example.

While the splitter 321 cannot be tuned in the same manner as tunable coupler TC1 (shown in FIG. 1), for example, because of the presence of the variable power dividers 320, the tuning capabilities of the transmitter chip 301 are maintained. As an example, the splitting ratio of each tunable coupler TC2, TC3 may be specifically set such that to effectively achieve a certain level of power uniformity or power ratio, as needed. For example, let it be desired that the level of power ratio at the output 201B for an incoming laser signal having 100% of an initial power be as follows: 12.5% of the input power at O1, 37.5% of the input power at O2, 37.5% of the input power at O3, and 12.5% of the input power at O4, as a simplified example. Knowing that the splitter 321 will divide the incoming laser signal (e.g., 326) in half, such that the resultant power of each split signal will be 50% of the original power, the tunable coupler TC2 may be tuned to have a splitting ratio of 25/75, such that the light signal exiting from output port O1 possesses a power that is 12.5% of the initial power, and that the light signal exiting from output port O2 possesses a power that is 37.5% of the initial power, per the example. Similarly, the tunable coupler TC3 may be tuned to have a splitting ratio of 75/25, such that the light signal exiting from output port O3 possesses a power that is 37.5% of the initial power, and that the light signal exiting from output port O4 possesses a power that is 12.5% of the initial power, for example. Thus, having the pair of tunable couplers TC2 and TC3 may allow control over the tuning of the output power across the four output ports 315. Moreover, due to the replacement of the first variable power divider (e.g., TC1) with the conventional splitter 321, an advantage is the further reduction in manufacturing costs as compared with the embodiment 101 of FIG. 1.

In general, for some applications the tuning of only tunable couplers TC2 and TC3 is sufficient, so the control of the tuning of the splitting ratios of the tunable couplers TC2 and TC3 in the embodiment of FIG. 3 may thus be simplified. As described previously above when referring to FIG. 2, the transmitter chip disclosed herein may be provided with a control algorithm adapted to selectively control the tuning of the splitting ratios. For the single laser case, as mentioned above, the tunable couplers TC2 and TC3 may be tunable for any splitting ratio of P1/P2 and P3/P4, respectively, which may yield a sufficient power output uniformity for certain applications. However, because the splitter 321 is fixed at a 50/50 splitting ratio, it should be noted that certain desired levels of output power uniformity or power ratio may not be achievable in this case. For these more complex combinations of output power percentages for the single laser case, which would thus require a higher number of variable power dividers, it may be preferable to utilize the transmitter chip 101 of FIG. 1, for example.

In the dual laser source case, as an example, two laser sources (not shown) may launch two optical signals 325A and 325B into the input ports LS2 and LS3, respectively, as similarly described when referring to FIG. 1. Since the laser light signals 325A and 325B do not pass through the splitter 321 when propagating along the transmitter chip 301, the splitter 321 essentially has no effect on the dual laser case shown in FIG. 3. As such, the embodiment 301 shown in FIG. 3 is essentially the same, in terms of functionality, as the embodiment 101 of FIG. 1 for the dual laser case, since in both transmitter chip variations the two incoming laser light beams 325A/125A and 325B/125B are only acted upon by the tunable couplers TC2 and TC3, respectively. Thus, the operation of the transmitter chip 301 for the dual laser case is the same as that described above when referring to FIG. 1. Additionally, the tunable couplers TC2 and TC3 may be tuned and controlled according to the control algorithm described previously above when referring to FIG. 2, for the dual laser case. Thus, in terms of manufacturing costs, the embodiment of the transmitter chip 301 shown in FIG. 3 may be preferable for the dual laser case.

It should be understood that all the operations described above with reference to the transmitter chip 301 may be automated, as described previously when referring to FIG. 1, via the control algorithm (FIG. 2) in an external computer, for example. Compared with the transmitter chip of FIG. 1, automated control of the transmitter chip 301 shown in FIG. 3 may be slightly more simplified, since the computer only needs to tune two variable power dividers, as opposed to the three of FIG. 1, for example. Furthermore, the configuration shown in FIG. 3 may still enable channel shut-off, as described previously when referring to FIG. 1, as a benefit for meeting certain product specifications. As will be described throughout this disclosure below, the transmitter chip 301 may be further modified and/or simplified, such that the transmitter chip is adapted specifically for either the single laser case or the dual laser case.

Figure 4:
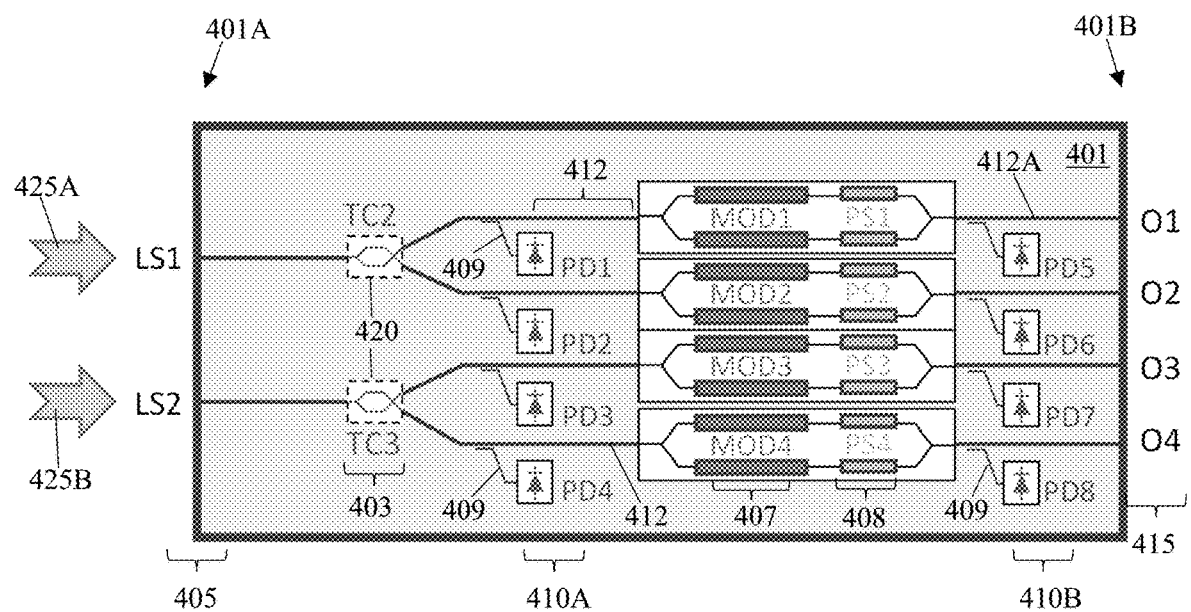
FIG. 4 is a diagram illustrating a top view of a two-input integrated four-channel transmitter chip having variable power dividers, according to an aspect.

FIG. 4 is a diagram illustrating a top view of a two-input integrated four-channel transmitter chip 401 having variable power dividers 420, according to an aspect. As mentioned above, the integrated transmitter chip disclosed throughout this disclosure may be modified such that to accommodate specifically either the single laser case or the dual laser case. As will be described in detail below, the transmitter chip 401 shown in FIG. 4 may be configured specifically for use with two laser sources (not shown).

As shown in FIG. 4, the transmitter chip 401 may be provided with two input ports 405 (LS1 and LS2) optically connected to two variable power dividers 420 (tunable couplers TC2 and TC3), respectively. As shown, the tunable couplers TC2 and TC3 may be provided in a single stage 403, each being provided as a 1×2 tunable coupler, as opposed to the 2×2 tunable couplers shown previously in FIGS. 1 & 3, for example. As shown, the transmitter chip 401 may be a multi-channel chip comprising four optical channels 412, for example, where the optical channels 412 have two sets of photodetectors 410A and 410B, a set of modulators 407, a set of phase shifters 408, and four output ports 415, as similarly described throughout this disclosure above. As shown, the first input port LS1 may optically connect to the input of the tunable coupler TC2 and may be branched off into a first pair of optical channels of the four optical channels 412. Similarly, as shown, the second input port LS2 may optically connect to the input of the tunable coupler TC3 and may be branched off into a second pair of optical channels of the four optical channels 412, for example. The input ports LS1 and LS2 may receive two incoming laser beams 425A and 425B, respectively, as shown, which may be directed toward and subsequently split by the pair of tunable couplers TC2 and TC3, as similarly described throughout this disclosure above. Thus, the optical power of two incoming laser light beams being split into four laser light beams may be effectively transmitted to an external device (e.g., a fiber array) (not shown) optically aligned to the output ports O1-O4 at the output edge 401B of the transmitter chip 401, as an example.

As similarly described above, the tunable couplers TC2 and TC3 may be tunable, such that their respective splitting ratios may be adjusted and controlled (via the external computer, for example). The first set of photodetectors 410A may measure the light intensity, and thus the power, of each of the signals travelling along the optical channels 412, such that to aid the external computer in monitoring the power and thus the tuning of the splitting ratios, as described above. As described throughout this disclosure above, the tunable couplers TC2 and TC3 may control the output power of the transmitter chip via their respective splitting ratios (following the control algorithm shown in FIG. 2, for the dual laser case) and may thus also enable channel shut-off for effectively closing one or more optical channels 412, as an example. As stated above, it should be understood that the embodiment of the transmitter chip 401 shown in FIG. 4 is specifically designed for use with two laser sources for the transmission of optical power. Thus, due to the omission of the third input port and the splitter (e.g., 321 in FIG. 3) or the first-stage tunable coupler (e.g., TC1 in FIG. 1), the footprint of the chip can be smaller, increasing the production output, as well as reducing the manufacturing costs associated with manufacturing the transmitter chip 401. Thus, it may be preferable to utilize the embodiment 401 of FIG. 4 when transmitting optical power using two laser sources. Furthermore, as similarly described above when referring to FIG. 3, the omission of the first-stage variable power divider (e.g., tunable coupler TC1) may also further simplify the control algorithm programmed to control the splitting ratios of the variable power dividers 420, as an example.

Figure 5:
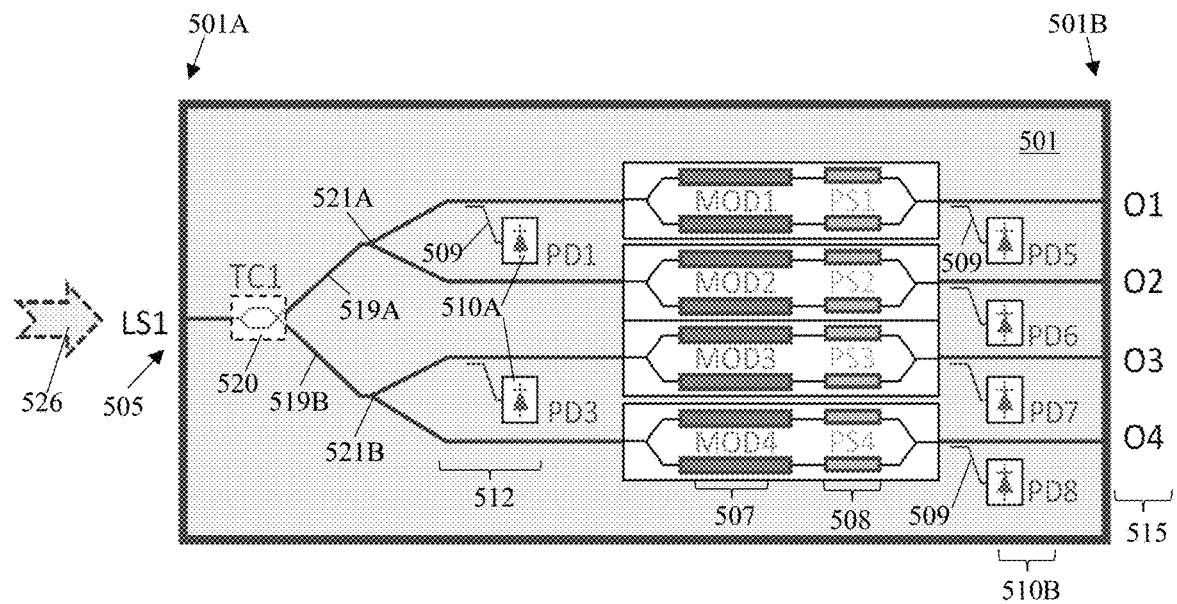
FIG. 5 is a diagram illustrating a top view of a single-input integrated four-channel transmitter chip having a variable power divider, according to an aspect.

FIG. 5 is a diagram illustrating a top view of a single-input integrated four-channel transmitter chip 501 having a variable power divider 520, according to an aspect. As described above, the integrated transmitter chip disclosed herein may be modified, such that to accommodate specifically the dual laser case, as shown previously in FIG. 4. As will be described in detail below, the transmitter chip 501 shown in FIG. 5 may be configured specifically for transmitting optical power originating from a single laser source.

As shown in FIG. 5, the transmitter chip 501 may be provided with a single input port 505 (LS1) optically connected to a single 1×2 variable power divider 520 (e.g., tunable coupler TC1), as an example. As shown, the tunable couplers TC2 and TC3, shown previously in FIG. 4, for example, may be provided as 1×2 splitters, for example. As shown, the transmitter chip 501 may be a multi-channel chip comprising four optical channels 512, where the optical channels 512 have a first and a second set of photodetectors 510A and 510B, respectively, disposed before and after a set of modulators 507 and a set of phase shifters 508, respectively, and finally four output ports 515 (O1-O4), as similarly described previously above. For emphasis, as opposed to the previous embodiments shown in FIGS. 1 & 3-4, the transmitter chip 501 of FIG. 5 may need only two photodetectors PD1 and PD3, as shown, in the first set of photodetectors 510A disposed before the modulators 507, as mentioned above. Because only one variable power divider 520 is provided on the transmitter chip 501, utilizing the photodetectors PD1 and PD3 disposed after the splitters 521A and 521B, respectively, as shown, may be sufficient for providing feedback data (e.g., power measurements) to the external computer, for example, regarding the tuning of the tunable coupler TC1. Thus, due to the omission of the second stage variable power dividers (e.g., tunable couplers TC2 and TC3) and two photodetectors of the first set of photodetectors (e.g., PD2 and PD4) the transmitter chip 501 may be more compactly designed, thus reducing manufacturing costs, as an advantage.

As shown, the input port LS1 may optically connect to the input of the variable power divider (tunable coupler TC1) 520 and may be branched off into two optical channels/waveguides 519A and 519B. The branched waveguides 519A and 519B may optically connect to the pair of splitters 521A and 521B, respectively, disposed on the transmitter chip 501, as shown. As similarly described above, the splitters 521A and 521B may be conventional splitter couplers, whose splitting ratios are each fixed at 50/50, for example. The branched waveguides 519A and 519B may each be split equally by the splitters 521A and 521B, respectively, and may thus form the four optical channels 512, as shown. The input port 505 may receive an incoming laser beam 526, as shown, which may be directed toward and subsequently split by the variable power divider 520, as similarly described throughout this disclosure above. The resultantly split light beams (not shown) may then propagate along the waveguide branches 519A and 519B toward the pair of splitters 521A and 521B, respectively, and may subsequently be split a second time, such that four laser light beams (not shown) may propagate along the optical channels 512. Thus, the optical power of the incoming laser light beam being split into four laser light beams may be effectively transmitted to a fiber array (not shown) optically aligned at the output 501B of the transmitter chip 501, as an example.

As similarly described above, the variable power divider 520 may be tunable such that the splitting ratio may be adjusted and controlled (via an external computer, for example). As shown, the tuning of the input power may occur prior to the splitting of the optical signal by the splitters 521A and 521B, for example. Thus, the control algorithm (described previously when referring to FIG. 2) may be adapted, based on product specifications, constraints, and/or desired output power, to tune the splitting ratio of TC1 with respect to the fixed 50/50 splitting ratios following afterwards (corresponding to the splitters 521A and 521B). The first set of photodetectors 510A may measure the powers of two of the signals being split by the splitters 521A and 521B, and the second set of photodetectors 510B may measure the powers of the four optical signals travelling along the optical channels 512, such that to aid the external computer in monitoring the tuning functionality, as described above. As an example, the variable power divider 520 may control the output power of the transmitter chip 510 via its splitting ratio and may thus also enable channel shut-off. However, because only one variable power divider 520 is used in this embodiment 501, either outputs O1 and O2 will be closed, or outputs O3 and O4 will be closed. As such, if the shutting off of only one optical channel is desired, the embodiment 501 shown in FIG. 5 may not be preferable. On the other hand, for example, it may be possible to substantially enact single channel shut off using other on-chip means than the tunable coupler 520, such as VOAs (as described above), the phase shifters 508, etc.

As stated above, it should be understood that the embodiment of the transmitter chip 501 shown in FIG. 5 is specifically designed for use with a single laser source in the transmission of optical power. Thus, due to the omission of the second and third input ports (e.g., LS2 and LS3) and the second and the fourth photodetectors (e.g., PD2 and PD4), the footprint of the chip can be smaller, benefiting the production volume, as well as reducing the manufacturing costs associated with manufacturing the transmitter chip 501. Thus, it may be preferable to utilize the embodiment 501 of FIG. 5 when transmitting optical power using one laser source. Furthermore, as similarly described above when referring to FIG. 4, the omission of the second-stage variable power dividers (e.g., tunable couplers TC2 and TC3) may also further simplify the control algorithm programmed to control the splitting ratio of the variable power divider 520, as an example.

As mentioned previously throughout this disclosure above, the integrated transmitter chip disclosed herein may comprise any number of optical channels, greater or lesser than the four channels shown in the drawings previously. Additionally, as will be described herein below, the integrated transmitter chip may be provided with a greater number of input ports than the three shown herein previously (e.g., LS1-LS3). Finally, as will also be described in detail below, the integrated transmitter chip may comprise a larger number of variable power dividers than the three shown previously in the drawings (e.g., tunable couplers TC1-TC3).

Figure 6:
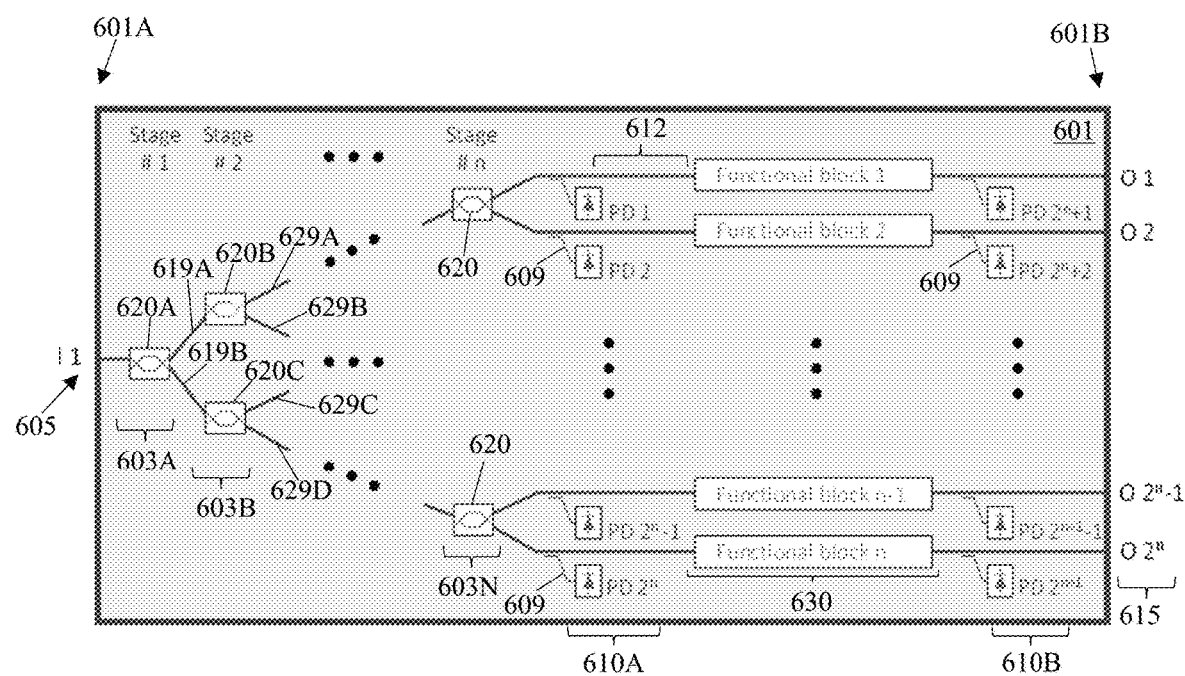
FIG. 6 is a diagram illustrating a top view of a single-input integrated multi-channel transmitter chip having n-stage cascaded variable power dividers, according to an aspect.

FIG. 6 is a diagram illustrating a top view of a single-input integrated multi-channel transmitter chip 601 having n-stage cascaded variable power dividers 620, according to an aspect. As shown in FIG. 6, the integrated multi-channel transmitter chip 601 may comprise a single input port 605 (I1) disposed at a first end 601A. Thus, as will be described in detail below, the transmitter chip 601 shown in FIG. 6 may be configured specifically for transmitting optical power originating from a single laser source and may thus be an alternative embodiment of that shown previously in FIG. 5, as an example.

As shown, the integrated transmitter chip 601 may comprise an n number of stages of cascaded variable power dividers 620, as an example. As opposed to the previously described embodiments of the disclosed integrated transmitter chip, the embodiment 601 shown in FIG. 6 showcases that many more than three variable power dividers may be provided on a single chip, as needed, depending on the size of the chip and the number of optical channels 612, for example. As shown as an example in FIG. 6, the input port I1 may be adapted to receive laser light and may optically connect to a first variable power divider 620A disposed at Stage #1 (603A). As similarly described throughout this disclosure above, the variable power divider 620A may divide the input port I1 into a first waveguide branch 619A and a second waveguide branch 619B, as an example. As shown, the first and the second waveguide branches 619A and 619B may connect to a second and a third variable power dividers 620B and 620C, respectively, which are disposed at Stage #2 (603B), as an example. The second and the third variable power dividers 620B and 620C, respectively, may divide/split each waveguide branch 619A and 619B, respectively, into subsequent pairs of waveguide branches, as an example. As shown as an example, the variable power divider 620B may divide the first waveguide branch 619A into waveguides 629A and 629B, and the variable power divider 620C may divide the second waveguide branch 619B into waveguides 629C and 629D, for example.

As mentioned previously above, the transmitter chip 601 may comprise n stages of cascaded variable power dividers 620. As shown in FIG. 6, following the second stage 603B variable power dividers 620B and 620C a plurality of variable power dividers may be disposed on the transmitter chip 601 and interconnect between the waveguide pairs 629A and 629B and 629C and 629D, respectively, and the variable power dividers 620, respectively, disposed at Stage #n (603N), for example. It should be understood that any number of variable power dividers may be provided between Stage #2 and Stage #n, and that each variable power divider may branch an input waveguide branch into a pair of corresponding waveguide branches, as similarly described above. As shown, following the variable power dividers 620 at Stage #n (603N), which is the last stage of cascaded variable power dividers, for example, a plurality of optical channels 612 may be provided, as indicated, from two minimum optical channels up to $2^n$ optical channels, where n corresponds to the number of stages of cascaded variable power dividers, as mentioned previously above. As shown in FIG. 6, each optical channel 612 may be provided with a first photodetector PD, optically connected via a tap coupler 609, with the total number of photodetectors 610A corresponding to the total number of optical channels 612, that is, a $2^n$ number of photodetectors 610A, for example. It should be understood that each optical channel of the plurality of optical channels may directly or indirectly connect to a variable power divider (for power tuning and channel shut-off capabilities, for example).

As shown in FIG. 6, the plurality of optical channels 612 may further comprise a plurality of functional blocks 630, each functional block having a modulator (e.g., 507 in FIG. 5) and a phase shifter (e.g., 508 in FIG. 5). It should be understood that, depending on the particular application, additional or fewer optical components may be provided in the functional blocks 630, as desired. As shown, following the set of functional blocks 630, a second set of photodetectors 610B may be provided on the plurality of optical channels 612 and optically connected via tap couplers 609, for example, the number of second photodetectors PD being $2^{n+1}$, as indicated. Finally, as shown as an example, each optical channel may conclude with an output port 615 disposed at an output end 601B of the integrated transmitter chip 601, the output ports 615 being adapted to couple optical light, and therefore optical power, out of the transmitter chip 601. As indicated, the total number of output ports 615 may correspond to the total number of optical channels, which depends on the number of stages 603N, and is defined by $2^n$, for example.

As described similarly throughout this disclosure above, the variable power dividers (e.g., 620) may be realized using tunable couplers (1×2 or 2×2 tunable couplers, for example), for example, having adjustable splitting ratios. As previously discussed, optical signals traversing through the variable power dividers are split, such that their respective optical powers are divided according to the adjusted splitting ratio. Furthermore, as also described previously, the splitting ratios may be electrically controlled by an external computer programmed with a control algorithm for setting the splitting ratios of each of the tunable couplers, as appropriate.

As an example, let the transmitter chip 601 shown in FIG. 6 comprise 3 stages of cascaded variable power dividers, such that n=3, for example. As such, the transmitter chip 601 may thus comprise seven variable power dividers (e.g., tunable couplers), with four of the seven variable power dividers being disposed at the third stage (i.e., 603N), eight optical channels 612, sixteen total photodetectors PD, with a first eight being disposed at 610A and a second eight being disposed at 610B, eight functional blocks 630, and finally, eight output ports 615. As such, modifying the control algorithm described previously when referring to FIG. 2 for the single laser case, let there be eight power output targets P1-P8 corresponding to laser light signals being output from the eight output ports O1-O8, respectively, for this particular example. Accordingly, for example, to properly set the variable power dividers, such that to enable a pre-defined power output target P1-P8 at the output end 601B of the transmitter chip 601, where P1-P8 each define the output power target for each of the eight optical channels 612, let the splitting ratio of the four variable power dividers disposed at Stage #3, in this example, be set to P1/P2, P3/P4, P5/P6, and P7/P8, respectively. The splitting ratios of the second and the third variable power dividers 620B and 620C, respectively, may then be adjusted to (P1+P2)/(P3+P4) and (P5+P6)/(P7+P8), respectively, for example. The splitting ratio of the first variable power divider 620A may then be adjusted to (P1+P2+P3+P4)/(P5+P6+P7+P8), for example. Finally, the input laser source may be adjusted until the laser light outputs all are equal to or substantially equal to the output power targets P1-P8 for the output ports O1-O8, respectively, as desired.

The control algorithm programmed and running on the external computer may thus be modified appropriately, as described above per the example, to accommodate a plurality of alternative embodiments of the single-input, multi-channel, n-stage transmitter chip shown in FIG. 6, depending on the number of stages of cascaded variable power dividers provided, for example. Thus, the method of the tuning the splitting ratios of the variable power dividers such that to control the output power of the transmitter chip is not limited to 4-channel transmitter chips and may therefore be applied to transmitter chips having any number of optical channels, as an advantage. It should be understood that, if desired and/or necessary, to achieve certain power uniformity capabilities, a greater or lesser number of variable power dividers may be disposed at Stages #1 and #2, etc., than those shown in FIG. 6, as an example. As will be described in detail below, the integrated transmitter chip shown in FIG. 6 may be configured to accommodate multiple laser sources, rather than solely the single laser case described herein above.

Figure 7:
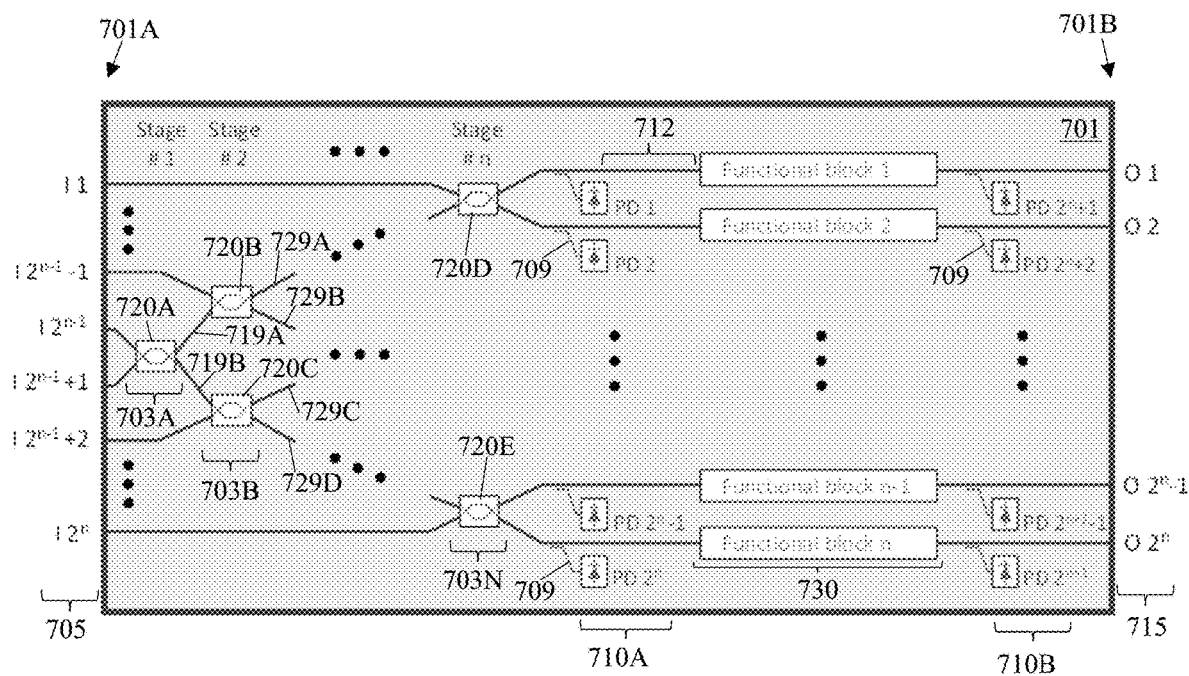
FIG. 7 is a diagram illustrating a top view of a multi-input integrated multi-channel transmitter chip having n-stage cascaded variable power dividers, according to several aspects.

FIG. 7 is a diagram illustrating a top view of a multi-input integrated multi-channel transmitter chip 701 having n-stage cascaded variable power dividers 720, according to several aspects. As shown in FIG. 7, the integrated multi-channel transmitter chip 701 may comprise a plurality of input port 705, defined according to the number of stages of cascaded variable power dividers, as will be discussed in more detail below, and disposed along a first end 701A. Thus, as will be described in detail below, the transmitter chip 701 shown in FIG. 7 may be configured specifically for transmitting optical power originating from a plurality of laser sources (i.e., one, two or more) and may thus be an alternative embodiment of that shown previously in FIG. 1, as an example.

As shown, the integrated transmitter chip 701 may comprise an n number of stages of cascaded variable power dividers 720, as similarly shown in FIG. 6, for example. As opposed to the previously described embodiments of the disclosed multi-input integrated transmitter chip, the embodiment 701 shown in FIG. 7 showcases that many more than three variable power dividers may be provided on a single chip, as needed, depending on the size of the chip and the number of optical channels 712, for example. As indicated in FIG. 7, the plurality of input ports 705 may each be adapted to receive laser light, and, as stated above, the number of input ports 705 being defined according to the n number of stages. As shown as an example, each input port (e.g., I1-I$2^n$) may optically extend and connect to a variable power divider (e.g., 720) disposed at a stage (e.g., Stage #1) 703A-703N along the integrated transmitter chip 701. For example, a first input port I1 may optically connect to a top-most variable power divider 720D, and the last input port I$2^n$ may optically connect to a bottom-most variable power divider 720E, as shown. As similarly described throughout this disclosure above, each variable power divider (e.g., 720A, 720B) may divide their respectively connected input port (e.g., I1) into a first waveguide branch and a second waveguide branch, as an example. For example, referring to variable power divider 720A disposed at Stage #1 (703A), which may be realized using a 2×2 tunable coupler, a first and a second input ports (labeled I$2^{n-1}$ and I$2^{n-1}$+1) may each be optically branched, as shown, into a first and a second waveguides 719A and 719B, respectively. As such, laser light signals being launched into input ports I$2^{n-1}$ and I$2^{n-1}$+1 may each be divided/split (according to the splitting ratio of variable power divider 720A) and directed respectively through waveguides 719A and 719B, for example. It should be understood that, depending on the number of input ports and the configuration of the transmitter chip 701, each of the variable power dividers provided may be 2×2 or 1×2 tunable couplers, as needed, as an example.

As shown, referring still to variable power divider 720A, the first and the second waveguide branches 719A and 719B may connect to a second and a third variable power dividers 720B and 720C, respectively, which are disposed at Stage #2 (703B), as an example. The second and the third variable power dividers 720B and 720C, respectively, may divide/split each waveguide branch 719A and 719B, respectively, into subsequent pairs of waveguide branches, as an example. As shown as an example, the variable power divider 720B may divide the first waveguide branch 719A into waveguides 729A and 729B, and the variable power divider 720C may divide the second waveguide branch 719B into waveguides 729C and 729D, for example. Each of the second and the third variable power dividers 720B and 720C may be realized using 2×2 tunable couplers in this example. It should be understood that, if desired and/or necessary, to achieve certain power uniformity capabilities, a greater or lesser number of variable power dividers may be disposed at Stages #1 and #2, as an example.

As mentioned previously above, the transmitter chip 701 may comprise n stages of cascaded variable power dividers 720. As shown in FIG. 7, following the second stage 703B variable power dividers 720B and 720C a plurality of variable power dividers may be disposed on the transmitter chip 701 and interconnect between the waveguide pairs 729A and 729B and 729C and 729D, respectively, and the variable power dividers 720C and 720D, respectively, disposed at Stage #n (703N), for example. It should be understood that any number of variable power dividers may be provided between Stage #2 and Stage #n, and that each variable power divider may branch an input waveguide branch into a pair of corresponding waveguide branches, as similarly described above. As shown, following the variable power dividers 720 at Stage #n (703N), which is the last stage of cascaded variable power dividers, for example, a plurality of optical channels 712 may be provided, as indicated, from the minimum $2^{n-1}$+1 optical channels up to a maximum of $2^n$ optical channels, where n corresponds to the number of stages of cascaded variable power dividers, as mentioned previously above. As shown in FIG. 7, each optical channel 712 may be provided with a first photodetector PD, optically connected via a tap coupler 709, with the total number of photodetectors 710A corresponding to the total number of optical channels 712, that is, a $2^n$ number of photodetectors 710A, for example. It should be understood that each optical channel of the plurality of optical channels may directly or indirectly connect to a variable power divider (for power tuning and channel shut-off capabilities, for example). It should also be understood that, when the n number of stages is large, some waveguide crossing may be required due to the increased layout complexity of the integrated transmitter chip. Such waveguide crossings are omitted from the diagram of FIG. 7 for simplicity.

As shown in FIG. 7, the plurality of optical channels 712 may further comprise a plurality of functional blocks 730, as previously described when referring to FIG. 6, each functional block having a modulator (e.g., 507 in FIG. 5) and a phase shifter (e.g., 508 in FIG. 5). It should be understood that, depending on the particular application, additional or fewer optical components may be provided in the functional blocks 730, as desired. As shown, following the set of functional blocks 730, a second set of photodetectors 710B may be provided on the plurality of optical channels 712 and optically connected via tap couplers 709, for example, the number of second photodetectors 710B being $2^n$, as indicated. Finally, as shown as an example, each optical channel may conclude with an output port 715 disposed at an output end 701B of the integrated transmitter chip 701, the output ports 715 being adapted to couple optical light, and therefore optical power, out of the transmitter chip 701. As indicated, the total number of output ports 715 may correspond to the total number of optical channels, which depends on the number of stages 703N, as mentioned above, and is defined by $2^n$, for example.

As described similarly throughout this disclosure above, the variable power dividers (e.g., 720) may be realized using tunable couplers, for example, having adjustable splitting ratios. As previously discussed, optical signals traversing through the variable power dividers are split, such that their respective optical powers are divided according to the adjusted splitting ratio. Furthermore, as also described previously, the splitting ratios may be electrically controlled by an external computer programmed with a control algorithm for setting the splitting ratios of each of the tunable couplers, as appropriate.

As an example, let the transmitter chip 701 shown in FIG. 7 comprise 3 stages of cascaded variable power dividers, such that n=3, for example. As such, the transmitter chip 701 may thus comprise eight input ports 705, seven variable power dividers (e.g., tunable couplers), with four of the seven variable power dividers being disposed at the third stage (i.e., 703N), eight optical channels 712, sixteen total photodetectors PD, with a first eight being disposed at 710A and a second eight being disposed at 710B, eight functional blocks 730, and finally, eight output ports 715. It should be understood that not all eight of the input ports I1-I8 may necessarily be used during any given operation of the transmitter chip 701. As similarly described previously above when referring to FIG. 6, the control algorithm shown previously in FIG. 2 may be modified from the dual laser case to appropriately accommodate the now 8-channel transmitter chip in this example. As such, let there be eight power outputs P1-P8 corresponding to laser light signals being output from the eight output ports O1-O8, for this particular example. Accordingly, for example, to properly set the variable power dividers, such that to enable a power output target P1-P8 for each of the output ports O1-O8, respectively, at the output end 701B of the transmitter chip 701, where P1-P8 each define the output power target for each of the eight optical channels 712, let the splitting ratio of the four variable power dividers disposed at Stage #3, in this example, be set to P1/P2, P3/P4, P5/P6, and P7/P8, respectively. The splitting ratios of the second and the third variable power dividers 720B and 720C, respectively, may then be adjusted to (P1+P2)/(P3+P4) and (P5+P6)/(P7+P8), respectively, for example. Finally, each of the input laser sources (e.g., minimum of one laser source) may be adjusted until the laser light outputs are all equal to or substantially equal to output power targets P1-P8 for the output ports O1-O8, respectively, as desired.

The control algorithm programmed and running on the external computer may thus be modified appropriately, as described above per the example, to accommodate a plurality of alternative embodiments of the multi-input, multi-channel, n-stage transmitter chip shown in FIG. 7, depending on the number of stages of cascaded variable power dividers provided, for example. Thus, the method of tuning the splitting ratios of the variable power dividers such that to control the output power of the transmitter chip is not limited to 4-channel transmitter chips having three input ports and may therefore be applied to transmitter chips having any number of optical channels, as an advantage.

As described throughout this disclosure above, the tuning of the variable power dividers may be achieved by various suitable means, such as, for example, electro-optic effect, thermo-optic effect, magnetic-optic effect, mechanical effect, MEMS, etc. As an example, the tuning can be further optimized or improved using various approaches, such as using differential thermo-optic phase shifting, and/or using undercuts or trenches for lower power consumption. While the tuning of the tunable couplers has been described herein as being controlled and achieved by a computer control algorithm, the tuning may alternatively be controlled manually (e.g., by a user). Additionally, the transmitter chip and the optical components described herein may be applicable to various integrated photonics platforms, such as, for example, those based on silicon, silicon nitride, silica, lithium niobate, polymer, III-V materials, hybrid material platforms, etc. The transmitter chip disclosed herein may be used with optical signals at wavelength ranges other than O-band, such as, for example, the visible light range, or E, S, C and/or L-bands. In addition, the disclosed transmitter chip may be used for other optical applications than power transmission for data-center applications, such as, for example, optical communications, optical sensing, optical computing, automotive applications, quantum applications, etc.

It should be understood that, as used throughout this disclosure above, percentages stated with reference to the splitting ratios of the tunable couplers are idealized and exemplary, and that in practice the divided percentages of the input power may be lower than actually stated due to natural loss, error, etc. It should be noted that the laser sources used herein may be any suitable type of laser, such as, for example, semiconductor-based lasers, fiber-based lasers, gas-based lasers, etc., as needed for the optical application. It should also be understood that other light sources may be used other than a laser, as described above. For example, it may be possible for a light-emitting diode (LED), amplified spontaneous emission (ASE) source, or any other suitable light source, to be utilized with the integrated transmitter chip disclosed herein above. It should also be understood that the illustrated size of the transmitter chip, as well as the sizes of the various optical components, is not drawn to scale and should therefore not be interpreted or limited as such. It should also be understood that, as shown in FIG. 4, for example, a fewer or greater number of photodetectors may be used with the transmitter chip disclosed herein. Furthermore, while it was mentioned above that germanium photodetectors are used in the disclosed invention, it should be understood that any suitable type of photodetector may be used. While MZI modulators are depicted throughout the drawings herein, it should be understood that any suitable type of modulator may be used, such as, for example, ring modulator, directional coupler modulator, photonic crystal modulator, Bragg grating modulator, electro-absorption modulator, etc.

Figure 8:
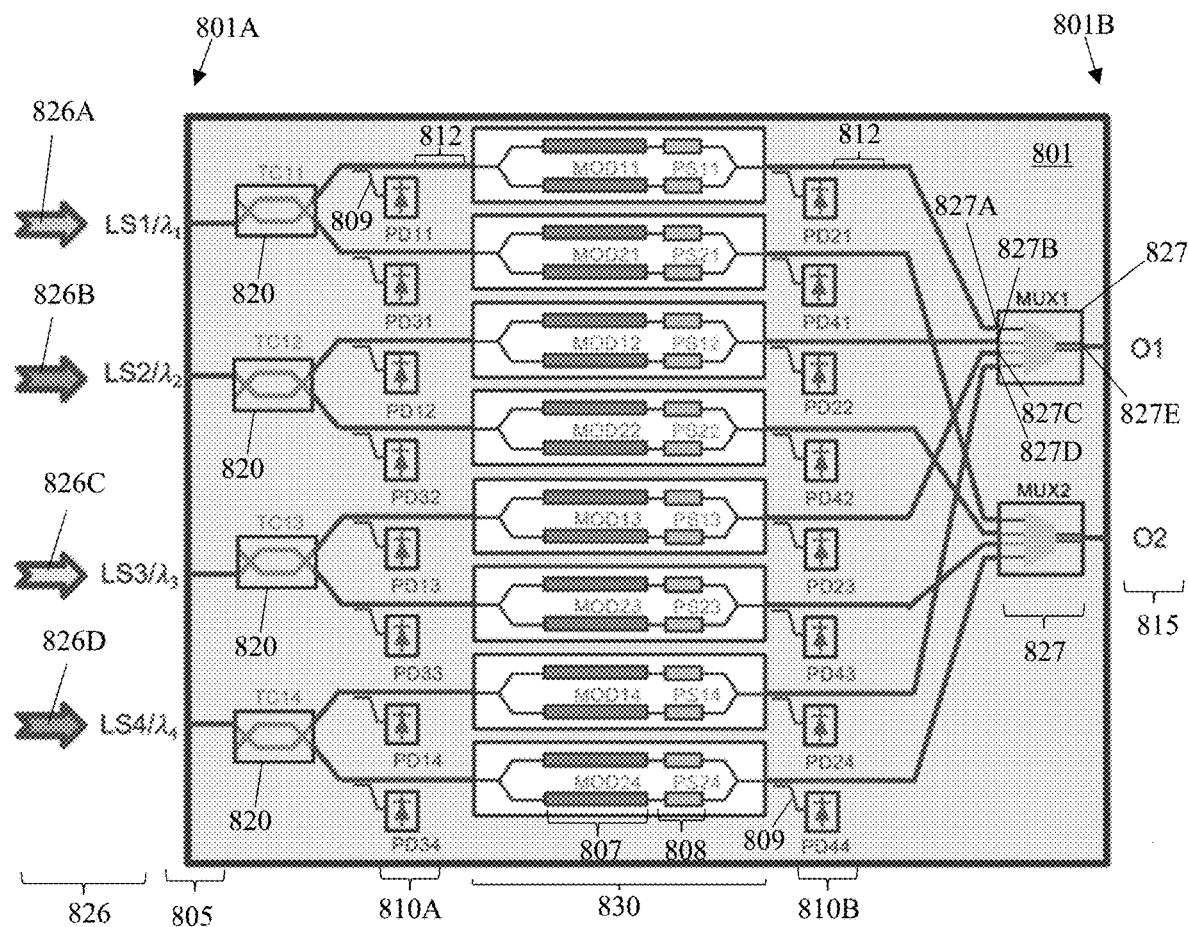
FIG. 8 is a diagram illustrating a top view of an integrated four-input eight-optical channel transmitter chip having two four-channel multiplexers and two outlet ports (2×4), according to an aspect.

FIG. 8 is a diagram illustrating a top view of an integrated four-input eight-optical channel transmitter chip 801 having two four-channel multiplexers 827 and two outlet ports (2×4), according to an aspect. The herein disclosed transmitter chip 801 of FIG. 8 may be similar to the transmitter chip 401 of FIG. 4 but may be referred to as a WDM-enhanced 2×4 transmitter and have several notable differences. As can be seen, the transmitter chip 801 may include four input ports 805 disposed at its first end 801A with only two outlet ports 815 on its second end 801B. Thus, the disclosed transmitter chip of 801 uses twice as many laser beams 826, twice as many input ports 805, and twice as many optical channels 812, but half as many output ports 815, as the transmitter chip 401 of FIG. 4. In order to facilitate a reduced quantity of outlet ports 815 present on this transmitter chip 801, while doubling the transmission capacity of the transmitter chip 801, said transmitter chip 801 may implement two wavelength division multiplexers ("WDM multiplexers", "WDMs", "multiplexers") 827 to combine the eight total optical channels 812 within the transmitter chip 801 into two outlet ports 815 by the time said optical channels 812 reach the second end 801B of the transmitter chip, effectively combining eight optical signals into a two multi-wavelength output optical signals.

As with the previous disclosed transmitter chips, the following transmitter chips 801, 901, 1001 of FIGS. 8-10B may be configured to support PAM signals. While the usage of four unique lasers beams 826 may result in the disclosed transmitters chips 801, 901, 1001 of FIGS. 8-10B appearing more complicated when compared to the less complex transmitter chips disclosed hereinabove, such as transmitter chip 401 of FIG. 4, said transmitters chips 801, 901, 1001 may be configured to produce significantly more unique optical signals than less complex transmitter chips. This would effectively allow multiple simpler transmitter chips utilized within a transceiver to be replaced with fewer, more complex ones, thus reducing the complexity of the overall transceiver assembly.

The disclosed transmitter chip 801 of FIG. 8 may use four laser beams 826 that are each optically connected to a corresponding input port 805 on the first end 801A of the transmitter chip 801, wherein each of the four laser beams 826 is monochromatic and has a different wavelength. These laser beams may be comprised of a first laser beam 826A having a first wavelength ($\lambda_1$), a second laser beam 826B having a second wavelength ($\lambda_2$), a third laser beam 826C having a third wavelength ($\lambda_3$), and a fourth laser beam 826D having a fourth wavelength ($\lambda_4$). For example, a transmitter utilized for Coarse WDM ("CWDM") applications may have a first wavelength of 1271 nm, a second wavelength of 1291 nm, a third wavelength of 1311 nm and fourth wavelength of 1331 nm, thus having a 20 nm channel spacing. It should be understood that each of these wavelengths may be modified accordingly for other applications, such as Dense WDM application, LAN WDM applications, etc.

As described above, each of the laser beams 826 (LS1-LS4) may have a unique wavelength when compared to the other laser beams. Upon each laser beam 826 entering a corresponding input port 805, each laser beam 826 may travel through a corresponding variable power divider 820 in order to split each laser beam 826 into two separate optical channels 812, and thus two split laser beams. Each optical channel 812 may travel into a corresponding functional block 830 having an MZI modulator 807 and a phase shifter 808 for suitable encoding and phase shifting of the split laser beams 826 traveling through their corresponding optical channels 812 into modulated optical signals. After emerging from a functional block 830, each produced optical signal may continue traveling through its respective optical channel 812 until it is multiplexed within a corresponding WDM 827. Each WDM 827 may have a first, second, third and fourth multiplexer input (827A, 827B, 827C and 827D, respectively) and a final multiplexer output 827E, wherein said WDM 827 is configured to combine the different wavelength optical signals entering each multiplexer input into an output optical signal that travels out of its final multiplexer output 827E and finally the corresponding output port 815 of the transmitter chip 801.

Each WDM 827 may be configured to optically connect to a specific optical channel 812 from each laser beam 826. As can be seen in FIG. 8, one of the two optical channels branched from each laser beam 826 may be optically connected to each WDM 827. This configuration depicted in FIG. 8, as well as FIG. 9A and FIG. 10A, wherein each WDM 827 is optically connected to each laser beam 826 by a corresponding optical channel 812 provides the disclosed transmitter 801 with various advantages. Each variable power divider 820 may be utilized to adjust the power of its corresponding split laser beam, and thus the power of its corresponding optical signal independently of the power of other optical signals, thus affording the transmitter a significant deal of operational flexibility. This feature of independently tunable signals, each having a unique wavelength, that are multiplexed into a multi-wavelength output optical signal prior to transmission increases the manufacturing yield of said transmitter, while simultaneously reducing transmitter cost per unique signal generated. Utilization of the disclosed transmitted chip 801 within a transceiver (not shown) may double the transmission capacity of the transceiver assembly, when compared to utilizing transmitter chip 401 of FIG. 4 within the same transceiver assembly, while using proportionally the same number of lasers sources 826, thus reducing the transmitter cost per unique optical signal generated. As such, this configuration of transmitter may utilize fewer output connections when compared to previously disclosed configurations, thus reducing the transmitter cost.

A key advantage of the herein disclosed integrated transmitter chip 801 of FIG. 8 is that said transmitter chip 801, through the use of a plurality of tunable couplers 820 may generate twice as many optical signals as it has incoming laser beams 826, similarly to transmitter chip 401 of FIG. 4. However, unlike the transmitter chip 401 of FIG. 4, the transmitter chip 801 of FIG. 8 may only have two outlet ports 815, each of which carries four different wavelength signals combined into a single output optical signal. By having these four different wavelength signals multiplexed into a single output optical signal, the disclosed transmitter chip 801 of FIG. 8 may utilize fewer output cables per unique wavelength optical signal, thus saving on cable costs. Additionally, because the variable power dividers 820 are capable of selectively adjusting the power of the split laser beams 826 travelling through their corresponding optical channels 812, and thus independently control the output power of each wavelength sent to each output port, the transmitter may maintain its ability to fine tune each wavelength of the output optical signal. This allows the transmitter chip 801 to transmit a large amount of data quicky, while allowing for independently tuning of a signal output within each wavelength and requiring fewer output connections, thus further reducing costs.

It should be understood that each of the photodetectors 810A, 810B and the variable power dividers 820 may be in electronic communication with a computer, as described hereinabove, such that the optical power directed through each optical channel 812 may be measured and suitably adjusted by a user or autonomously by a computer system. Unless otherwise noted, the various components described hereinbelow may function comparably to their equivalents disclosed in previous embodiments. For example, the first photodetectors 810A for each optical pathway 812 may be used to measure the power of the laser beam entering each functional block 830, whereas the second photodetectors 810B may be used to measure the power of the optical signal exiting each corresponding functional block 830, accordingly, wherein both the first and second photodetectors 810A, 810B are configured to be electronically attached to a computer configured to adjust their corresponding variable power dividers 820 accordingly. Further embodiments utilizing the disclosed WDM are discussed hereinbelow. The disclosed transmitters of 801, 901, 1001, etc. of FIG. 8, 9A, 10A, etc. may be incorporated in small form factor pluggable optical transceivers, such as QSFP-DD, OSFP, CFP2, CFP4 that can support various high data rate applications (for example, 50 Gbps, 100 Gbps, or 200 Gbps of each optical channel 812).

As can be seen in FIGS. 8-10B, each laser beam 826, 926, 1026 may follow a particular optical path before being split, encoded as an optical signal, multiplexed and transmitted out of the integrated transmitter chip 801, 901, 1001. For example, as seen in FIG. 8, each laser beam 826 may enter the transmitter chip 801 through a corresponding input port 805 before being split by a corresponding variable power divider 820 into corresponding split laser beam. Each split laser beam may travel though corresponding functional block having an MZI modular 807 and a phase shifter 808 configured to encode the corresponding split laser beam into an optical signal and phase shift said optical signal, accordingly. Next, an optical signal from each laser beam 826 may travel into a corresponding WDM 827, such that each WDM 827 receives an optical signal from each laser beam 826. Finally, each WDM 827 may multiplex and selectively polarize the incoming optical signals into an output optical signal having two unique polarization modes, which will be discussed in greater detail hereinbelow. These optical pathway may be suitably modified by additional, cascading variable power dividers 820, wherein each laser beam 826 would be further split into additional split laser beams which are used to generate additional optical signals which are multiplexed within additional WDMs 827, as seen in transmitter chip 901 of FIG. 9A. Regardless of the configuration, each WDM 827 is configured to be optically connected to one optical channel from each unique laser beam 826, such that the WDM 827 receivers a plurality of optical signals, each of which has a different wavelength.

In order to provide an ideal WDM 827, said WDM 827 must achieve certain criteria. One such criteria is that the pass-band insertion loss for said WDM 827 should be minimized. Minimization of the insertion loss over the pass band will allow the utilization of said WDM 827 to only minimally impact the power requirements for the associated transmitter 801, thus reducing the operating cost. Additionally, the pass-band for the WDM should be sufficiently flat, such that amount of insertion loss is approximately the same over the wavelength ranged defined by said pass-band. By having a flat pass band, the WDM 827 may perform consistently, regardless of potential temperature fluctuations that may occur during device operation. The desire to have both a low insertion loss for the pass-band, as well as a flat pass-band will be further articulated hereinbelow. In an example, a pass-band may be considered to have a low insertion loss if it has a consistent insertion loss of less than 1.0 dB over the bandwidth.

The utilization of the disclosed WDMs 827 with the variable power dividers 820 within a transmitter chip 801 may provide said transmitter chip 801 with unique capabilities. The combination of the variable power dividers 820 with the WDMs 827 allows for the power of each optical signal present in the final multiplexed output optical signal leaving each WDM 827 to be individually adjusted, thus allowing the output optical signals to be tuned based upon the needs of the application. The WDMs 827 also complement the functionality of variable power dividers 820 as well, as the variable power dividers 820 are configured to split a singular input into multiple outputs, while the WDMs 827 are configured to combine multiple optical signals into a singular input, thus minimizing external elements and maximizing the quantity of unique signals generated. As such, high complexity signals may be generated to optimize data transmission speeds, while limiting the amount of input light beams 826 and outgoing optical connections needed, thusly reducing transmitter cost while maintaining or increasing transmitter efficiency. The ability of the variable power dividers 820 to adjust the output power of each wavelength of optical signal from the laser beams 826 to each output port 815 independently may increase the manufacturing yield while reducing the cost of the incorporated transmitter 801.

Figure 9A:
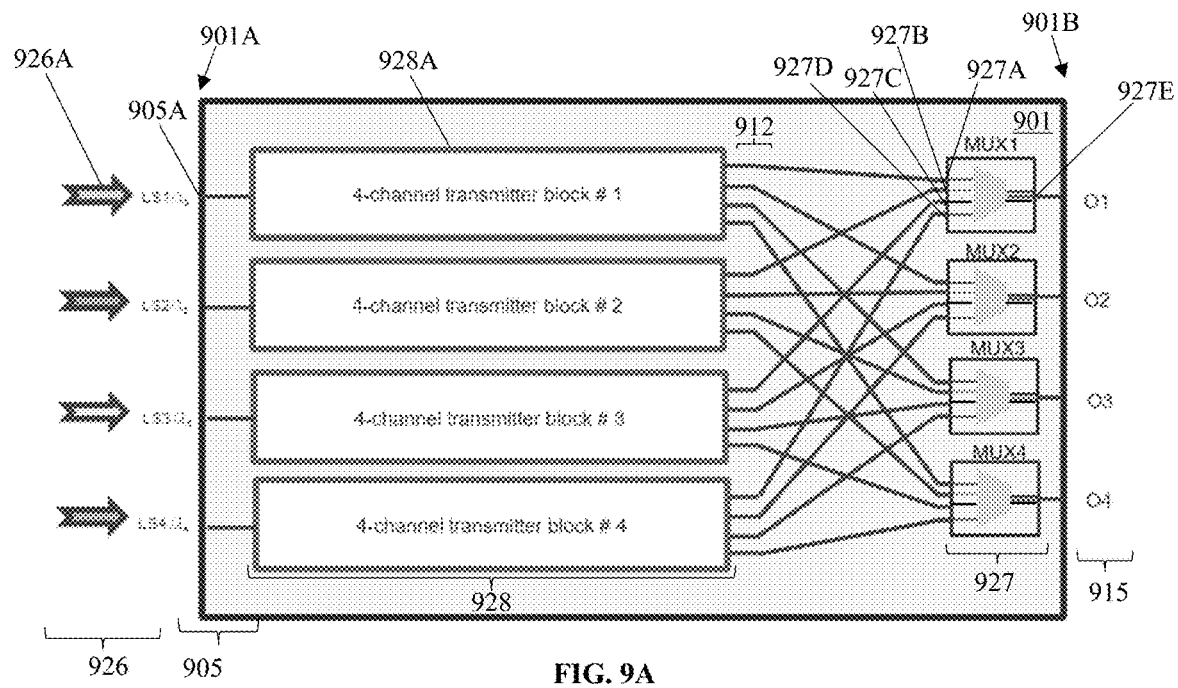
FIG. 9A is a diagram illustrating a top view of an integrated four-input 16-optical channel transmitter chip having four four-channel multiplexers and four outlet ports (4×4), according to an aspect.
Figure 9B:
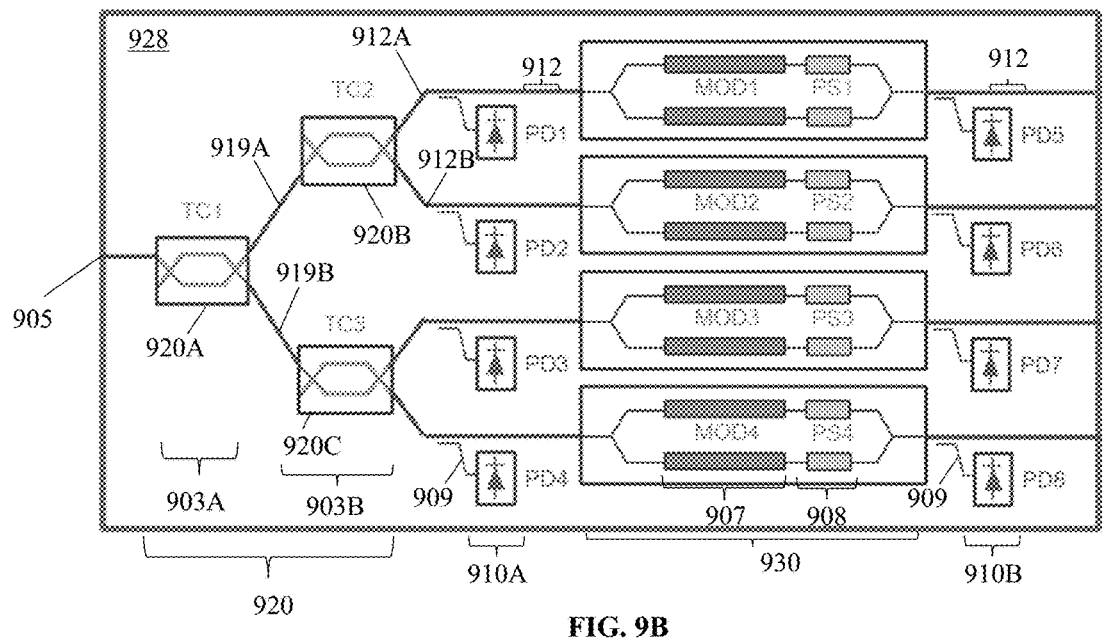
FIG. 9B is a diagram illustrating a top view of a single input four-channel transmitter block configured for use within the transmitter chip of FIG. 9A, according to an aspect.

FIG. 9A is a diagram illustrating a top view of an integrated four-input, 16-optical channel transmitter chip 901 having four four-channel multiplexers 927 and four outlet ports 915 (4×4), according to an aspect. FIG. 9B is a diagram illustrating a top view of a single input four-channel transmitter block configured for use within the transmitter chip 901 of FIG. 9A, according to an aspect. Similarly to transmitter chip 801 of FIG. 8, the transmitter chip of FIGS. 9A-9B may be referred to as a WDM-enhanced 4×4 transmitter. By utilizing more than one stage of variable power dividers 920 for each wavelength of laser beam 926 traveling through the disclosed transmitter chip 901, the capacity of said transmitter chip 901 may be further increased, while simultaneously reducing the cost of the transmitter chip 901 per unique optical signal generated. As can be seen in FIG. 9A, the transmitter chip 901 may be configured to receive four laser beams 926, similarly to transmitter 801 of FIG. 8. However, transmitter 901 may generate 16 total optical signals which are then multiplexed and transmitted through four outlet ports 915, effectively doubling the transmitter capacity, when compared to transmitter chip 801 of FIG. 8 and quadrupling the transmitter capacity, when compared to transmitter chip 401 of FIG. 4. Such increases to capacity that do not utilize proportionally more laser lights 926 may reduce the transmitter cost per unique optical signal generated.

As can be seen in FIG. 9B, the structure of each transmitter block 928 may have three variable power dividers 920. First, a laser beam 926 may enter transmitter 901 through a corresponding first variable power divider 920A, acting as the first stage 903A of cascading variable power dividers, splitting a singular wavelength laser beam into two split beams that each travel within corresponding separate waveguides 919A, 919B, similarly to what is described in transmitter chip 101 of FIG. 1. Then, each split beam exiting the first variable power divider 920A may be further split into two separate optical channels 912A, 912B by either a second variable power divider 920B or third variable power divider 920C, both belonging to a second stage 903B of variable power dividers. The second and third variable power dividers 920B, 920C may be optically branched from the first variable power divider 920A, accordingly. Each split laser beam exiting a second stage 903B variable power divider may travel through a corresponding channel 912A, 912B before entering a functional block 930 for modulation and phase shifting. These two stages of variable power dividers 920 are configured to split a singular laser beam 926 into four separate split laser beams that are directed through four separate optical channels 912. Each optical signal generated from a specific laser beam 926 may be multiplexed within a different WDM 927, such that each WDM 927 combines four optical signals of different wavelengths into a singular output optical signal, which is subsequently transmitted through the corresponding outlet port 915. This allows the four incoming laser beams 926 to be used to generate 16 unique optical signals which are then multiplexed into four outgoing output optical signals, each exiting the transmitter chip 901 through a corresponding outlet port 915.

By utilizing multiple stages 903A, 903B of cascading variable power dividers 920, similarly to what is seen in transmitter 101 of FIG. 1, the transmitter chip 901 of FIG. 9 may generate twice as many optical signals as the transmitter chip 801 of FIG. 8, each of which may be individually tuned, thus providing an increase to manufacturing yield while reducing the transmitter cost per unique signal generated. Unlike transmitter chip 101 of FIG. 1, each variable power divider 920 within the transmitter chip 901 acts as a 1×2 coupler, thus turning a singular wavelength laser beam 926 into four split beams, and subsequently four separate optical signals. As described hereinabove, each channel 912 exiting a specific transmitter block 928 may be optically connected to a different WDM 927, such that each multiplexer 927 receives and multiplexes four different wavelength optical signals into a combined output optical signal. The mechanism through which the disclosed WDM 927 combines each of the incoming optical signals will be discussed in greater detail hereinbelow.

As with the prior described transmitter 801 chip of FIG. 8, transmitter chip 901 of FIG. 9A may use a plurality of variable power dividers 920 in conjunction with a plurality of WDMs 927 to generate a plurality of tunable multi-wavelength output optical signals, wherein the power of each wavelength signal within the multi-wavelength signal may be selectively adjusted. By incorporating a cascade of variable power couplers 920 within the transmitter chip 901, the disclosed transmitter chip 901 may allow for the generation of more unique, tunable signals, thus increasing the capacity of the transmitter chip 901 and manufacturing yield, while reducing the overall transmitter costs. This structure of utilizing cascading variable power dividers 920 may be expanded upon to include additional cascading stages, as will be discussed in greater detail hereinbelow.

As with the functional blocks 730, 830 of FIG. 7, FIG. 8, respectively, each functional block 930 of FIG. 9A may be preceded by a first photodetector 910A and followed by a second photodetector 910B, to provide a means of monitoring each produced signal. This may be the same for any described functional block herein, unless otherwise noted. Similarly, the disclosed transmitter chip 901 of FIG. 9A may have a first end 901A on which input ports 905 are disposed and a second end 901B on which output ports 915 are disposed. This may also be the same for all transmitter chips described herein.

It should be understood that each element of the herein disclosed transmitter chips 1001, 901, 801, etc. is suitably optically connected to elements on the same optical pathway. In the transmitter chip 901 of FIG. 9A-9B, a top-most laser beam 926A may enter the transmitter chip 901 through a top-most input port 905A. Said top-most input port 905A may be optically connected to a top-most transmitter block 928A, which itself is optically connected to each of the four WDMs 927. Each WDM 927 may be optically connected to a corresponding outlet port 915. As such, optical pathways may be defined by the path followed by a laser beam/signal traveling through optically connected elements. It should also be understood that certain optical components, such as the variable power dividers 920 may be optically connected to more than two elements, and thus may allow light to follow different optical pathways depending on how said elements are configured.

Figure 10A:
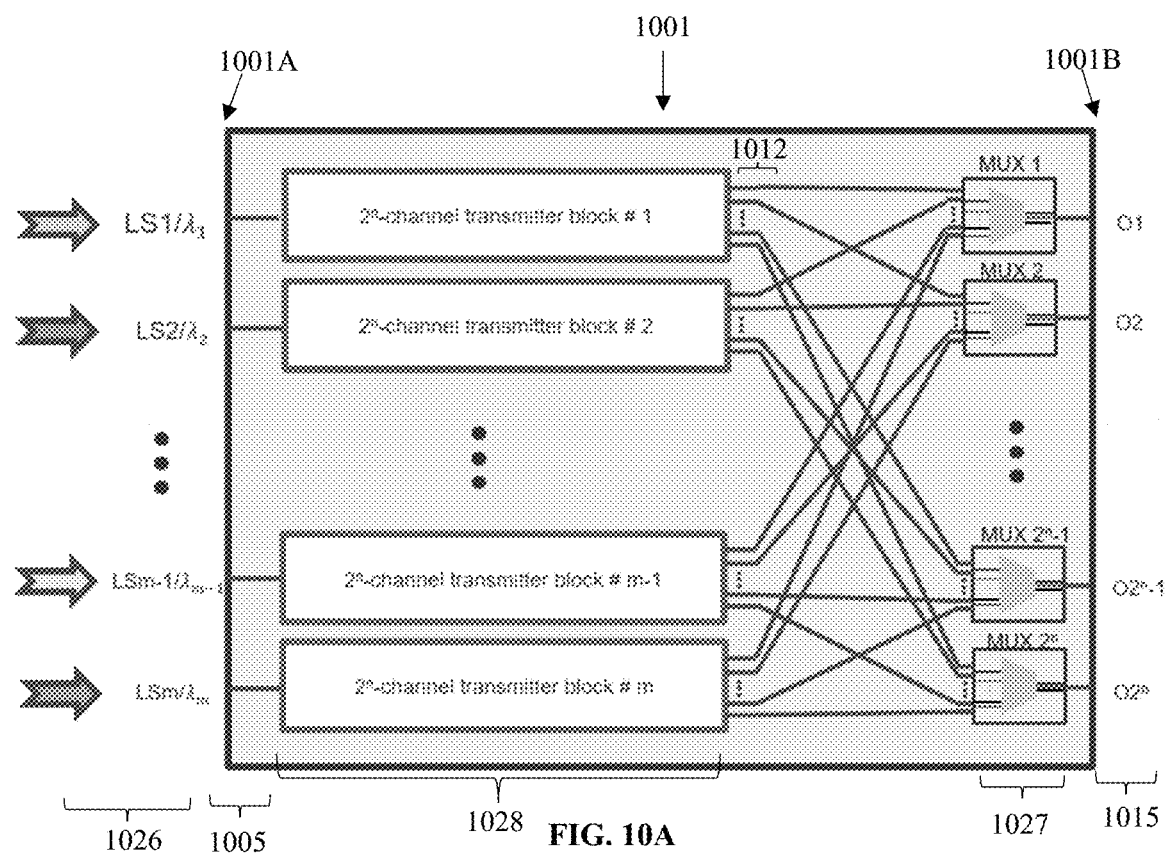
FIG. 10A is a diagram illustrating a top view of a multi-input integrated multi-channel transmitter chip having m number of $2^n$-channel transmitter blocks and $2^n$ of m channel wavelength division multiplexers, according to several aspects.
Figure 10B:
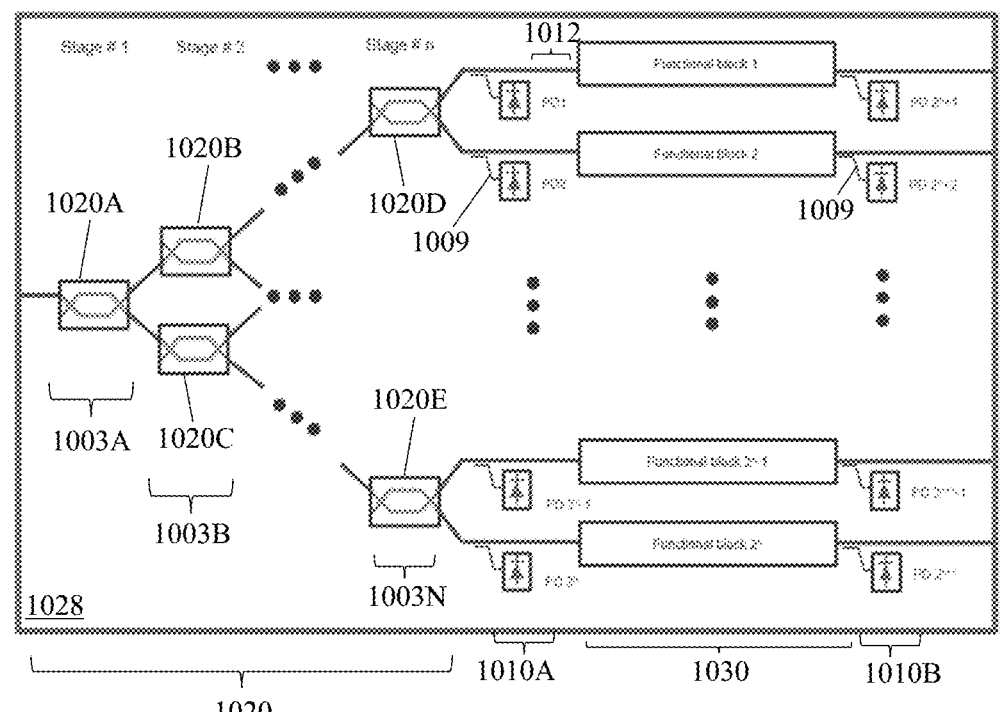
FIG. 10B is a diagram illustrating a top view of a single input $2^n$-channel transmitter block having n-stages of tunable power dividers and $2^n$ MZI modulators, wherein said transmitter block is configured for use within the transmitter chip of FIG. 10A, according to an aspect.

FIG. 10A is a diagram illustrating a top view of a multi-input integrated multi-channel transmitter chip 1001 having m number of $2^n$-channel transmitter blocks 1028 and $2^n$ of m channel WDMs 1027, according to several aspects. FIG. 10B is a diagram illustrating a top view of a single input $2^n$-channel 1012 transmitter block 1028 having n-stages of tunable power dividers 1020 and $2^n$ MZI modulators, wherein said transmitter block 1028 is configured for use within the transmitter chip 1001 of FIG. 10A, according to an aspect. The transmitter chip 1001 of FIG. 10A-10B may be referred to as a WDM-enhanced $2^n$ X m photonic transmitter. The disclosed variable structure of the transmitter block 1028 of FIG. 10B may be the same as or similar to the variable structure of transmitter chip 601 of FIG. 6. Through incorporation of a plurality of WDMs 1027 within the transmitter chip 1001 of FIG. 10A, the plurality of generated signals may be multiplexed into fewer, more complex signals, in order to reduce the necessary quantity of outlet cables or comparable connection devices needed to transmit the output optical signals exiting the transmitter chip 1001, thus reducing costs.

The disclosed variable structure of transmitter chip 1001 may have a quantity of laser beams 1026, input ports 1005 and transmitter blocks 1028 defined by the variable "m", such that the transmitter chip 1001 has m laser beams, each of which is coupled into a corresponding transmitter block 1028 of the m total transmitter blocks 1028. Each transmitter block 1028 may have one or more variable power dividers 1020, wherein said power dividers 1020 may be arranged in a cascaded formation having at least one stage, wherein the number of stages is defined by the variable "n", as described previously in FIG. 6. As such, each transmitter block 1028 would have $2^n$ optical channels 1012. As such, a transmitter 1001 having an n value of two and an m value of four may be the same as transmitter chip 901 of FIG. 9A, having two cascading stages of variable power dividers 1020 (three power dividers 1020) and four transmitter blocks, each transmitter block having four optical channels 1012. As expected, these n and m values may be adjusted to provide a suitably sized and arranged transmitter chip 1001 for a given application. Similarly to the transmitter chip 701 of FIG. 7, the transmitter block 1028 of FIG. 10B may have a first variable power divider 1020A as the first stage 1003A of cascading variable power dividers 1020, a second variable power divider 1020B and a third variable power divider 1020C as the second stage 1003B of cascading variable power dividers, while including a top-most variable power divider 1020D and a bottom-most variable power divider 1020E in a final stage 1003N of cascading variable power dividers, all of which are arranged similarly to their counterparts in FIG. 7. Each second stage 1003B variable power divider 1020B may be optically branched from the first variable power divider 1020A, while each third stage variable power divider may be branched from the second or third variable power divider 1020B, 1020C, and so on.

Each of the variable power dividers 1020 may operate as a 1×2 coupler and split an incoming laser beam into two outgoing split laser beams. As with previously described embodiments, each split laser beam 1026 may pass by a first photodetector 1010A before entering the functional block 1030, whereas the corresponding optical signal exiting the functional block 1030 may pass by a second photodetector 1010B, such that the optical properties of each split laser beam and its resultant optical signal may be monitored and adjusted accordingly through manipulation of the corresponding variable power divider(s) 1020, again affording the transmitter great flexibility and increased manufacturing yield.

It should be understood that each WDM 1027 may be configured to multiplex more than four optical signals into a singular output optical signal. In an embodiment, the WDM 1027 may be configured to multiplex eight optical signals into a singular output signal, wherein the WDM 1027 would utilize a plurality of cascading AMZIs, or other comparable multiplexing subunits to multiplex the incoming optical signals into two combined optical signals before rotating the polarization of one of the combined optical signals and combining said combined optical signals to generate the output optical signal. Such a WDM 1027 may comprise two multiplexing subunits, such as multiplexing subunits 1131 of FIG. 11C, each of which utilize two cascading stages, similarly to how the variable power dividers 920 are arranged in FIG. 9A, but wherein the optical signals enter a multiplexing subunit as four separate inputs that leave as a singular output. After the input signals are suitably multiplexed into a total of two combined optical signals, said combined optical signals may travel into the polarization rotator and beam combiner ("PRBC"), such as polarization rotator and beam combiner 1132 of FIG. 11B, allowing for the use of both TE and TM polarization modes in each output optical signal. The utilization of TE and TM polarization modes will allow the WDM 1027 to use fewer cascading stages within corresponding multiplexing subunits. The advantage of a PRBC over cascading AMZIs is low insertion loss and flat transmission response for a wide wavelength range and thus minimization of effects due to wavelength shifts resulting from temperature and manufacturing variations. As such, the utilization of PRBC within a WDM 1027 allows for the relaxing of the design of said WDM 1027 and thus the resulting transmitter 1001. Another advantage of using a polarization rotator and beam combiner is eliminating the cascading AMZI stage having the narrowest wavelength spacing between the multiplexed channels. A wider wavelength separation will improve multiplexing subunit yield and thus reduce the transmitter cost. Additionally, said PRBC may inherently allow for the combination of signals having the same wavelength, as a result of utilizing orthogonal polarizations for each modulated signal. The WDM 1027 and its corresponding elements will be described in greater detail hereinbelow.

Figure 11A:
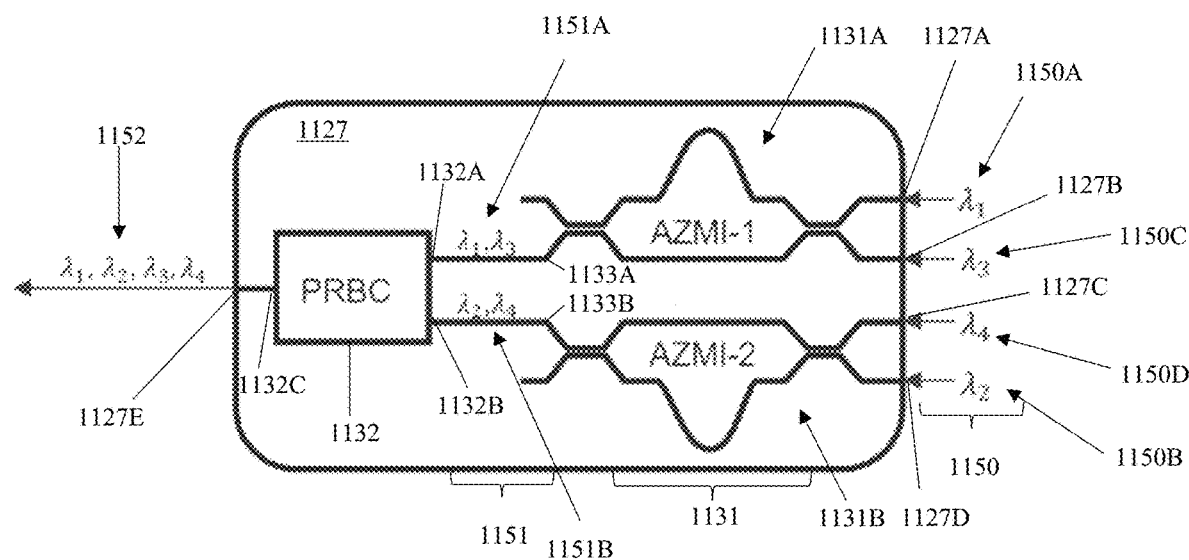
FIG. 11A is a diagram illustrating a top view of a four-channel dual polarization multiplexer, according to an aspect.
Figure 11B:
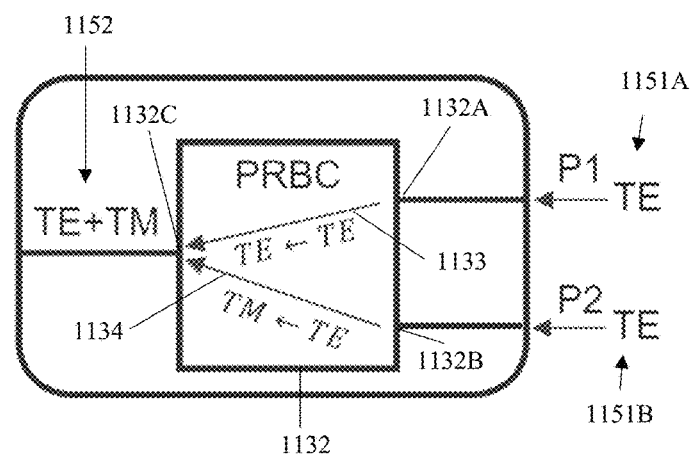
FIG. 11B is a diagram illustrating a top view of a polarization rotator and beam combiner for use within the four-channel dual polarization multiplexer, according to an aspect.
Figure 11C:
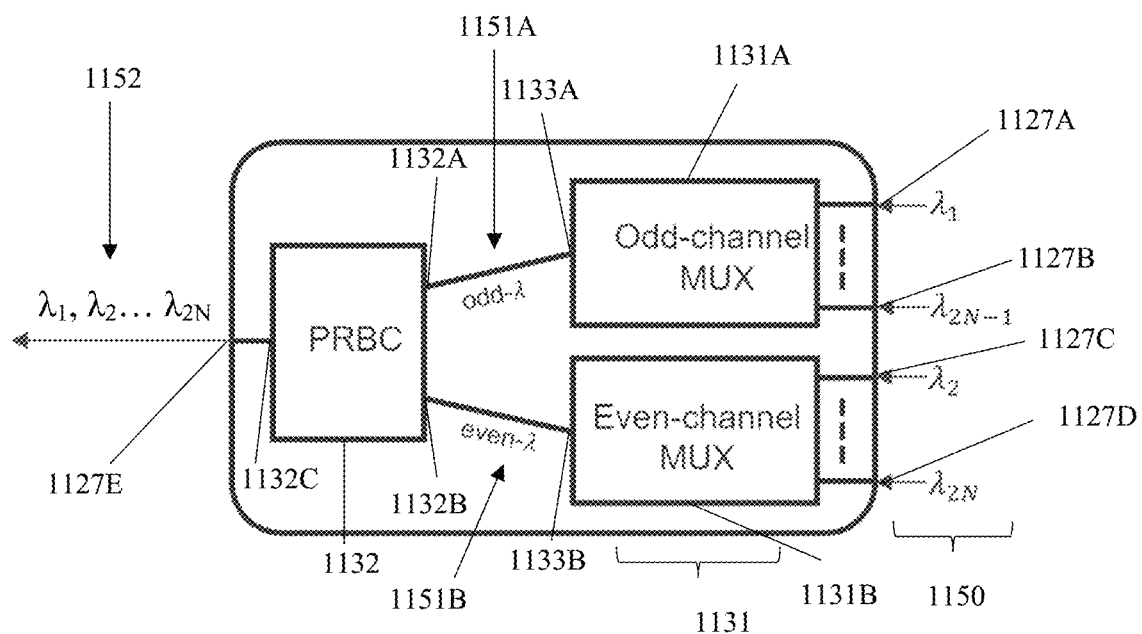
FIG. 11C is a diagram illustrating a top view of a 2N channel multiplexer, according to an aspect.

FIG. 11A is a diagram illustrating a top view of a four-channel dual polarization multiplexer 1127, according to an aspect. FIG. 11B is a diagram illustrating a top view of a polarization rotator and beam combiner 1132 for use within the four-channel dual polarization WDM multiplexer 1127, according to an aspect. FIG. 11C is a diagram illustrating a top view of a 2N channel dual polarization multiplexer 1127, according to an aspect. The disclosed four channel dual polarization WDM multiplexer 1127 of FIG. 11A, or an embodiment of its generic variant depicted in FIG. 11C, may be utilized in transmitter chips 801, 901, 1001 of FIG. 8, 9A or 10A, respectively, or any other suitable transmitter chip, as the WDMs. As seen in FIG. 11A, a four-channel dual polarization multiplexer 1127 may be comprised of two asymmetrical Mach-Zehnder Interferometers (AMZI) 1131A, 1131B optically connected to a PRBC 1132. The PRBC 1132 is configured to receive two different combined optical signals, one combined optical signal from each multiplexing subunit 1131 optically branched from it, change the polarization of one of the two combined optical signals, and simultaneously combine said two combined optical signals into a dual polarized, multi-wavelength output optical signal. Additionally, the WDM 1127 may use different types of multiplexer subunits 1131, such as echelle gratings, AWGs, etc., based on the application of the transmitter. As such, the disclosed multiplexer 1127 of FIG. 11C may be comprised of a first multiplexing subunit 1131A and a second multiplexing subunit 1131B optically branched from a polarization rotator and beam combiner 1132.

The disclosed four channel dual polarization multiplexer 1127 may include a first AMZI 1131A and a second AMZI 1131B. As described above, these two AMZIs 1131A, 1131B may be referred to as multiplexing subunits 1131, as a result of their utilization within the four-channel dual polarization multiplexer 1127. In the embodiment of FIG. 11A, the first multiplexer input 1127A may be optically connected to a corresponding optical channel from a first laser beam, while the second multiplexer input 1127B may be optically connected to corresponding optical channel from a third laser beam. Additionally, the third multiplexer input 1127C may be optically connected to a corresponding optical channel from a fourth laser beam, while the fourth multiplexer input 1127D may be optically connected to a corresponding channel from a second laser beam. The first and third optical channels may belong to the first plurality of optical channels with their corresponding optical signals belonging to the first plurality of optical signals. The second and fourth optical channels may belong to the second plurality of optical channels with their corresponding optical signals belonging to the second plurality of optical signals. Each optical signal of the first plurality of optical signals may have a wavelength belonging to a first plurality of wavelengths, wherein the wavelengths of the first plurality of wavelengths are evenly spaced (e.g., adjacent wavelengths are separated by the same wavelength spacing, 1271 nm, 1311 nm, 1351 nm, etc., for example). Similarly, each optical signal of the second plurality of optical signals may have a wavelength belonging to a second plurality of wavelengths, wherein the wavelengths of the second plurality of wavelengths are also evenly spaced. It should be understood that each "monochromatic" optical signal multiplexed within a specific WDM 1127 may have a different monochromatic wavelength, wherein the term "monochromatic" is used to indicate that each corresponding laser beam used to generate a specific optical signal only emits a singular wavelength. It should be understood that after modulation, the laser spectrum is expanded into a cluster of wavelengths around the laser beam's wavelength.

As can be seen in FIG. 11A, the first AMZI 1131A may have a first multiplexer input 1127A configured to receive a first optical signal 1150A having a first wavelength, $\lambda_1$, and second multiplexer input 1127B configured to receive a third optical signal 1150C having a third wavelength, $\lambda_3$. The first AMZI 1131 is configured to multiplex these first and third optical signals 1150A, 1150C into a first combined optical signal 1151A before outputting said first combined optical signal 1151A out of a first combined optical output 1133A. The second AMZI 1131B may be similarly arranged, having a third multiplexer input 1127C configured to receive a fourth optical signal 1150D having a fourth wavelength, and fourth optical input 1127D configured to receive a second optical signal 1150B having a second wavelength, $\lambda_2$. The second AMZI 1131 is configured to multiplex these second and fourth optical signals 1150B, 1150D into a second combined optical signal 1151B before outputting said second combined optical signal 1151B out of a second combined optical output 1133B. Each multiplexer input 1127A-1127D may be suitably attached to a corresponding optical channel to facilitate the hereinabove described multiplexing. The disclosed WDM 1127 of FIG. 11A may be the same as the WDM 927 used in transmitter chip 901 of FIG. 9A, wherein two corresponding optical channels are each configured to introduce a corresponding optical signal 1150A, 1150C to a first multiplexing subunit, while two other corresponding optical channels are each configured to introduce a different corresponding optical signal 1150B, 1150D to a second multiplexing subunit 1131, wherein no two optical signals 1150 fed into a specific WDM 1127 have the same wavelength. Each WDM 1127 may receive the same four unique wavelengths of optical signals, as a result of the configuration of the disclosed transmitter chips in which each laser has an optical path leading to each WDM 1127.

As described above, the optical channels optically attached to the first multiplexing subunit 1131A may be referred to as a first plurality of optical channels, wherein a first plurality of optical signals would enter said first multiplexing subunit 1131A through said first plurality of optical channels and be multiplexed into a first combined signal 1151A. Similarly, the optical channels optically attached to the second multiplexing subunit 1131B may be referred to as a second plurality of optical channels, wherein a second plurality of optical signals would enter said second multiplexing subunit 1131B through said second plurality of optical channels and be multiplexed into a second combined signal 1151B. For example, in the embodiment of FIG. 11A, a first and third optical channel carrying a first optical signal 1150A and a third optical signal 1150C, respectively, may be referred to as a first plurality of optical channels carrying a first plurality of optical signals. Furthermore, a second and fourth optical channels carrying a second optical signal 1150B and fourth optical signal 1150D, respectively, may be referred to as a second plurality of optical channels carrying a second plurality of optical signals. As such each optical signal that enters a WDM 1127 may be referred to as a "monochromatic" optical signal 1150, or an optical signal for simplicity, whereas each optical signal that exits a WDM 1127 may be referred to as an output optical signal.

In an embodiment, four wavelengths utilized within a transmitter chip may have equal spacing and said four wavelengths may be arranged in order of increasing wavelength, such that a smallest wavelength is next to a second smallest wavelength, the second smallest wavelength is next to a third smallest wavelength and the third smallest wavelength is next to a largest wavelength. This may allow the transmitter chip to be neatly organized and have a simplified structure. Each multiplexing subunit 1131 may be configured to have wavelength separation that is twice the size of the channel spacing. For example, a first multiplexing subunit, such as first multiplexing subunit 1131A, may be configured to receive a smallest wavelength, $\lambda_1$, and a third smallest wavelength, $\lambda_3$, while a second multiplexing subunit, such as second multiplexing subunit 1131B, may be configured to receive a second smallest wavelength, $\lambda_2$, and a largest wavelength, $\lambda_4$.

It should be understood that the term "equal spacing" (or equivalent language such as "evenly spaced") indicates that the wavelength differences between the first and second wavelengths, the second and third wavelength and the third and fourth wavelengths, etc. are equivalent (e.g., $\lambda_2-\lambda_1=\lambda_3-\lambda_2=\lambda_4-\lambda_3$). For example, in CWDM applications, the first, second, third and fourth wavelengths may be 1271 nm, 1291 nm, 1311 nm and 1331 nm, respectively, thus having an equal channel spacing of 20 nm. This "equal spacing" may also be present for a first plurality of optical signals entering the first multiplexing subunit 1131A ($\lambda_1, \lambda_3, \lambda_5$, etc.) and the second plurality of optical signals entering the second multiplexing subunit 1131B ($\lambda_2, \lambda_4, \lambda_6$, etc). As such, the difference between each adjacent wavelength within the first plurality and second plurality of optical signals may be "equally spaced" as well (e.g., $\lambda_3-\lambda_1=\lambda_5-\lambda_3, =\lambda_4-\lambda_2=\lambda_6-\lambda_4$, etc.).

The first combined optical output 1133A may be optically connected to a first combined optical input 1132A on the PRBC 1132 and the second combined optical output 1133B may be optically connected to a second combined optical input 1132B on the PRBC 1132. As such, the first combined optical signal 1151A and the second combined optical signal 1151B may both enter the PRBC 1132 in parallel. The PRBC 1132 is configured to maintain the polarization of the first combined optical signal 1151A entering through the first combined optical input 1132A while simultaneously rotating the polarization of the second combine optical signal 1151B entering through the second combined optical signal input 1132B. As can be seen in FIG. 11B, the first combined optical signal 1151A may maintain a TE-mode polarization while traveling through the PRBC 1132, while the second combined optical signal 1151B may travel through the PRBC 1132 and simultaneously have its polarization rotated from a TE-mode polarization to a TM-mode polarization. The combined signals 1151A and 1151B exit from PRBC output 1132C as an output optical signal 1152. As can be seen in FIG. 11A, each optical signal 1150 entering a WDM 1127 may have unique wavelengths, such that said output optical signal may have four different wavelength signals 1150 divided between its two different polarities, with the first and third optical signals 1150A, 1150C having TE-mode polarization and the second and fourth optical signals 1150B, 1150D having a TM-mode polarization. The output optical signal 1152 may comprise both TE and TM polarization signals before being exiting the WDM 1127 though a final multiplexer output 1127E for transmission to a corresponding output port.

As a result of the output optical signal 1152 being divided between two separate, non-interacting polarities, the output optical signal 1152 may more easily keep each wavelength of the incoming optical signals 1150 distinct, separate, and readable from each other. Alternatively, the utilization of dual polarization modes within the output optical signal 1152 may also allow the rate of data transmission to be doubled when compared to an output signal only using a single polarization mode. Each multiplexing subunit 1131 may utilize a plurality of multiplexing structures arranged in a cascading formation having multiple stages, similarly to the arrangement of variable power dividers 920 in FIG. 9B, such that the first plurality of optical signal may be suitably multiplexed into a first combined optical signal, and the second plurality of optical signals may be suitably multiplexed into a second combined optical signal. By utilizing the disclosed PRBC 1132, the amount of cascading multiplexing stages used in each multiplexing subunit 1131 may be reduced by one stage, thus allowing the disclosed WDM multiplexer 1127 to easily obtain a low insertion loss and a flat transmission response. Additionally, as described above, the disclosed WDM multiplexer 1127 may utilize polarization multiplexing to use two signals of the same wavelength to double the transmission capacity as used in a coherent application.

The disclosed four channel dual polarization multiplexer 1127 of FIG. 11A, and its generic variation depicted in FIG. 11C, belong to a class of WDMs that contain multiplexing subunits 1131. The first AMZI 1131A and the second AMZI 1131B may be arranged in parallel, such that both AMZIs are optically connected to/optically branched from the PRBC 1132 and corresponding pluralities of optical signals transmitted through each AMZI 1131 may be multiplexed together to form corresponding combined optical signals 1151, prior to being combined by the PRBC 1132. As such, the formed output signal 1152 may be comprised of a plurality of unique wavelengths, as seen in FIG. 11A. In the embodiment of FIG. 11A, the plurality of unique wavelengths may include a first, second, third and fourth wavelength, all of which are multiplexed, or otherwise combined, into an output optical signal. As described above, the PRBC 1132 is configured to change the polarization of the second and fourth optical signals 1150B, 1150D which were multiplexed into the second combined optical signal 1151B, such that the formed output signal 1152 is comprised of the two differently polarized combined optical signals, 1151A, 1151B, each combined optical signal being comprised of two different wavelength signals, for a total of four wavelengths in the output signal 1152.

As articulated in FIG. 11C, for transmitters having a large plurality of optical channels, the specific channels, and thus the specific signals that are multiplexed together in each cascading stage of each multiplexing subunit, may be selected based upon maximizing the wavelength difference between the optical signals 1150 multiplexed in each multiplexing subunit. For example, for an 8-channel dual polarization WDM (e.g., N has a value of 4), each multiplexing subunit 1131 may have 2 cascading stages of AZMIs, wherein the four incoming optical signals for a specific multiplexing subunit 1131 are all odd numbered or all even numbered wavelengths. For a first multiplexing subunit 1131A that multiplexes four odd numbered signals $\lambda_1, \lambda_3, \lambda_5$ and $\lambda_7$ having a first stage defined by an upper AMZI and a lower AMZI, the upper AMZI may be configured to multiplex signal $\lambda_1$ and signal $\lambda_5$, while the lower AMZI may be configured to multiplex signal $\lambda_3$ and signal $\lambda_7$.

The combined $\lambda_1/\lambda_5$ signal may then be multiplexed with the combined $\lambda_3/\lambda_7$ signal into a combined $\lambda_1/\lambda_3/\lambda_5/\lambda_7$ signal by the end of the first multiplexing subunit 1131A. A comparable process may be followed by the second multiplexing subunit 1131B, which may produce a combined $\lambda_2/\lambda_4/\lambda_6/\lambda_8$ signal. These combined signals from each multiplexing subunit may then be combined by the PRBC 1132, such that the combined $\lambda_1/\lambda_3/\lambda_5/\lambda_7$ signal ("combined odd signal") maintains a TE polarization mode while traveling on a first combiner path 1133, while the $\lambda_2/\lambda_4/\lambda_6/\lambda_8$ ("combined even signal") signal is rotated to assume a TM polarization mode while travel on a second combiner path 1134, thus allowing the combined odd signal 1151A and combined even signal 1151B to be further combined together with low insertion loss and flat transmission response. This mechanism effectively eliminates one cascading stage and doubles the channel spacing within each multiplexing subunit 1131 when compared to the channel spacing of the initially provided optical signals 1150.

In the disclosed embodiment of FIG. 11A, the first AMZI 1131A may have a free spectrum range (FSR) equal to double the difference between the wavelength of the third optical signal 1151C and the first optical signal 1151A (FSR$_1$=2($\lambda_3$−$\lambda_1$)), while the second AMZI 1131B may have a free spectrum range equal to double the difference between the wavelength of the fourth optical signal 1151D and second optical signal 1151B (FSR$_2$=2($\lambda_4$−$\lambda_2$)). The utilization of the PRBC 1132 within the disclosed WDM 1127 effectively doubles the FSR of each multiplexing subunit 1131. As such, the ratio of the pass-band to channel spacing within each multiplexing subunit for the WDM 1127 may be halved, thus allowing for low loss pass-bands to be easily implemented. This mechanism for achieving low loss pass-bands may be effective for a single AMZIs 1131 having a periodic, sinusoidal transmission spectrum. When this configuration is utilized with multiple cascaded AMZIs, or other comparable multiplexers, within each multiplexing subunit, a flat transmission pass-band may also be achieved. It should be understood that the disclosed wavelength of each optical signal 1150 may increase as the corresponding number of said optical signal 1150 is incremented. As such, a first optical signal may have a smallest wavelength, a second optical signal have a second smallest wavelength, and so on. As can be seen in FIG. 11C, the final output optical signal 1152 may contain a plurality of unique wavelengths from $\lambda_1$ to $\lambda_{2N}$, depending on the amount of signal that are multiplexed and combined.

An advantage of using the disclosed WDM multiplexer 1127 having a PRBC 1132 is said PRBC's inherently low insertion loss and its ability to achieve flat transmission over a wide range of wavelengths, (e.g., the PRBC is wideband). It should be understood that a flat transmission would have a consistent insertion loss over the range of applicable wavelengths. This flat transmission ensures that the functionality of the multiplexer is not notably affected by wavelength shifts that may occur as a result of temperature fluctuations in the transmitter assembly. The disclosed WDM 1127 may utilize a standard AMZI for each multiplexing subunit 1131, as depicted in FIG. 11A, but may also use any other suitable multiplexing structure, such as arrayed waveguide gratings (AWGs), echelle gratings ("planar concave gratings", "PCGs"), an AMZI based lattice filter (MZI-LF) and micro-ring resonators. As with the disclosed AMZIs, said multiplexing structures may be followed by the optically connected PRBC 1132, as depicted in FIG. 11A and FIG. 11C, wherein said PRBC 1132 is configured to rotate the output polarization of one of the multiplexing subunits 1131, as disclosed hereinabove. By utilizing WDMs 1127 configured to utilize PRBCs 1132 to combine two already complex, multiplexed optical signals into a singular dual polarization mode output optical signal, the transmission response associated with the transmitter/transceiver may be further optimized while minimizing the amount of outgoing optical connections, thus minimizing transmitter cost.

It may be advantageous to set forth definitions of certain words and phrases used in this patent document. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Further, as used in this application, "plurality" means two or more. A "set" of items may include one or more of such items. Whether in the written description or the claims, the terms "comprising," "including," "carrying," "having," "containing," "involving," and the like are to be understood to be open-ended, i.e., to mean including but not limited to. Only the transitional phrases "consisting of" and "consisting essentially of," respectively, are closed or semi-closed transitional phrases with respect to claims.

If present, use of ordinal terms such as "first," "second," "third," etc., in the claims to modify a claim element does not by itself connote any priority, precedence or order of one claim element over another or the temporal order in which acts of a method are performed. These terms are used merely as labels to distinguish one claim element having a certain name from another element having a same name (but for use of the ordinal term) to distinguish the claim elements. As used in this application, "and/or" means that the listed items are alternatives, but the alternatives also include any combination of the listed items.

As used throughout this application above, the phrases "laser light," "laser light beam," "laser beam," "light beam," "laser signal," "optical signal," and the like are interchangeable. Each of the aforementioned phrases and/or terms are intended to refer generally to forms of light, and more specifically, electromagnetic radiation used in the fields of optics and integrated photonics. As also used herein, the term "power" is to be interpreted as the power, in milliwatts, for example, of the laser signals being transmitted via the transmitter chip. Thus, if reference is made to the power of a particular optical channel or output port, it is to be understood as meaning the power of the laser signal travelling through said particular optical channel or output port, for example. Additionally, as used throughout this disclosure above, the phrases "variable power divider" and "tunable coupler" are used interchangeably.

Throughout this description, the aspects, embodiments or examples shown should be considered as exemplars, rather than limitations on the apparatus or procedures disclosed or claimed. Although some of the examples may involve specific combinations of method acts or system elements, it should be understood that those acts and those elements may be combined in other ways to accomplish the same objectives.

Acts, elements and features discussed only in connection with one aspect, embodiment or example are not intended to be excluded from a similar role(s) in other aspects, embodiments or examples.

Aspects, embodiments or examples of the invention may be described as processes, which are usually depicted using a flowchart, a flow diagram, a structure diagram, or a block diagram. Although a flowchart may depict the operations as a sequential process, many of the operations can be performed in parallel or concurrently. In addition, the order of the operations may be re-arranged. With regard to flowcharts, it should be understood that additional and fewer steps may be taken, and the steps as shown may be combined or further refined to achieve the described methods.

If means-plus-function limitations are recited in the claims, the means are not intended to be limited to the means disclosed in this application for performing the recited function, but are intended to cover in scope any equivalent means, known now or later developed, for performing the recited function.

Claim limitations should be construed as means-plus-function limitations only if the claim recites the term "means" in association with a recited function.

If any presented, the claims directed to a method and/or process should not be limited to the performance of their steps in the order written, and one skilled in the art can readily appreciate that the sequences may be varied and still remain within the spirit and scope of the present invention.

Although aspects, embodiments and/or examples have been illustrated and described herein, someone of ordinary skills in the art will easily detect alternate of the same and/or equivalent variations, which may be capable of achieving the same results, and which may be substituted for the aspects, embodiments and/or examples illustrated and described herein, without departing from the scope of the invention. Therefore, the scope of this application is intended to cover such alternate aspects, embodiments and/or examples. Hence, the scope of the invention is defined by the accompanying claims and their equivalents. Further, each and every claim is incorporated as further disclosure into the specification.

What is claimed is:

1. An integrated transmitter chip comprising:
   four input ports disposed at a first end of the integrated transmitter chip;
   a transmitter block optically connected to each input port of the four input ports, each transmitter block having:
      a first variable power divider optically connected to the corresponding input port;
      a second variable power divider and a third variable power divider being optically branched from the first variable power divider, such that the first, second and third variable power dividers are arranged in a cascading formation having two cascading stages, wherein the first, second and third variable power dividers each have a corresponding splitting ratio;
      a first and second optical channel being optically branched from the second variable power divider;
      a third and fourth optical channel being optically branched from the third variable power divider; and
   four wavelength division multiplexers optically connected to the transmitter blocks, each wavelength division multiplexer having:
      a first multiplexing subunit optically connected to two corresponding optical channels and configured to multiplex two corresponding optical signals into a first combined optical signal;
      a second multiplexing subunit optically connected to two corresponding optical channels and configured to multiplex two corresponding optical signals into a second combined optical signal; and
      a polarization rotator and beam combiner optically connected to the first multiplexing subunit and the second multiplexing subunit, the polarization rotator and beam combiner being configured to rotate the polarization of the second combined optical signal while combining the first combined optical signal and the second combined optical signal into a corresponding output optical signal.

2. The integrated transmitter chip of claim 1, wherein the first multiplexing subunit and the second multiplexing subunit of each wavelength division multiplexer are both asymmetrical Mach-Zehnder interferometers.

3. The integrated transmitter chip of claim 1, wherein each output optical signal has both TE-mode and TM-mode optical signals.

4. The integrated transmitter chip of claim 1, wherein each optical signal is monochromatic, and the power of each optical signal is independently adjusted through selective.

5. The integrated transmitter chip of claim 1, wherein each wavelength division multiplexer is optically connected to one optical channel from each transmitter block.

6. An integrated transmitter chip comprising:
   a plurality of input ports disposed at a first end of the integrated transmitter chip;
   a plurality of variable power dividers, wherein each input port of the plurality of input ports is optically connected to a corresponding variable power divider of the plurality of variable power dividers, each variable power divider being tunable to a corresponding splitting ratio;
   a plurality of optical channels, wherein two corresponding optical channels of the plurality of optical channels are optically branched from each variable power divider of the plurality of variable power dividers;
   a plurality of wavelength division multiplexers, each wavelength division multiplexer having a polarization rotator and beam combiner, wherein the polarization rotator and beam combiner of each wavelength division multiplexer of the plurality of wavelength division multiplexers is optically connected to corresponding optical channels of the plurality of optical channels.

7. The integrated transmitter chip of claim 6, each wavelength division multiplexer further comprising:
   a first multiplexing subunit optically connected to a first plurality of corresponding optical channels of the plurality of optical channels and configured to multiplex a first plurality of optical signals into a first combined optical signal; and
   a second multiplexing subunit optically connected to a second plurality of corresponding optical channels of the plurality of optical channels and configured to multiplex a second plurality of optical signals into a second combined optical signal;
   wherein the polarization rotator and beam combiner is optically connected to the first multiplexing subunit and the second multiplexing subunit, the polarization rotator and beam combiner being configured to rotate the polarization of the second combined optical signal while combining the first combined optical signal and the second combined optical signal into a corresponding output optical signal.

8. The integrated transmitter chip of claim 7, wherein a first plurality of wavelengths of the first plurality of optical signals has equal spacing and a second plurality of wavelengths of the second plurality of optical signals has equal spacing.

9. The wavelength division multiplexer of claim 7, wherein the first multiplexing subunit and the second multiplexing subunit are both asymmetrical Mach-Zehnder interferometers.

10. The integrated transmitter chip of claim 7, wherein each output optical signal has both TE-mode and TM-mode optical signals.

11. The integrated transmitter chip of claim 6, wherein each variable power divider of the at least one variable power divider is configured to work in conjunction with each corresponding wavelength division multiplexer to produce output optical signals wherein the power of each corresponding optical signal is independently controlled.

12. An integrated transmitter chip comprising:
at least one variable power divider; and
at least one wavelength division multiplexer optically connected to the at least one variable power divider, the at least one wavelength division multiplexer having:
a first multiplexing subunit configured to multiplex a first plurality of optical signals into a first combined optical signal;
a second multiplexing subunit configured to multiplex a second plurality of optical signals into a second combined optical signal;
a polarization rotator and beam combiner optically connected to the first multiplexing subunit and the second multiplexing subunit, the polarization rotator and beam combiner being configured to rotate the polarization of the second combined optical signal while combining the first combined optical signal with a second combined optical signal to produce an output optical signal;
wherein the integrated transmitter chip is configured to enable selective, automatic, and real-time tuning of a power of each optical signal of the first plurality of optical signals and the second plurality of optical signals.

13. The integrated transmitter chip of claim 12, wherein the first multiplexing subunit and the second multiplexing subunit are both asymmetrical Mach-Zehnder interferometers.

14. The integrated transmitter chip of claim 12, wherein the first multiplexing subunit and the second multiplexing subunit each comprise at least one cascading stage.

15. The integrated transmitter chip of claim 12, wherein the first plurality of optical signals and the second plurality of optical signals each comprise optical signals having TE-mode polarization.

16. The integrated transmitter chip of claim 12, wherein the polarization rotator and beam combiner is configured to rotate the polarization of the second combined optical signal from a TE-mode polarization to a TM-mode polarization, such that the output optical signal comprises both TE-mode optical signals and a TM-mode optical signals.

17. The integrated transmitter chip of claim 12, wherein each optical signal of the first plurality of optical signals and each optical signal of the second plurality of optical signals has a different wavelength.

18. The integrated transmitter chip of claim 12, wherein each variable power divider and each corresponding wavelength division multiplexer are configured to work in conjunction with each other to generate an output optical signal comprising a plurality of optical signals, each optical signal having a selectively chosen optical power based upon selective adjustment of corresponding splitting ratios of each variable power divider.

19. The integrated transmitter chip of claim 12, wherein the first plurality of optical signals comprises a first optical signal having a first wavelength and a third optical signal having a third wavelength, and the second plurality of optical signals comprises a second optical signal having a second wavelength and a fourth optical signal having a fourth wavelength, wherein the first wavelength is shorter than the second wavelength, the second wavelength is shorter than the third wavelength, and the third wavelength is shorter that the fourth wavelength, and the first, second, third and fourth wavelengths have equal spacing.

* * * * *